United States Patent
Yamamoto et al.

[11] Patent Number: 5,831,854
[45] Date of Patent: Nov. 3, 1998

[54] METHOD AND DEVICE FOR SUPPORTING THE REPAIR OF DEFECTIVE SUBSTRATES

[75] Inventors: Norihito Yamamoto, Shiga; Koichi Tanaka; Atsushi Hisano, both of Kyoto, all of Japan

[73] Assignee: Omron Corporation, Kyoto, Japan

[21] Appl. No.: 587,942

[22] Filed: Jan. 17, 1996

[30] Foreign Application Priority Data

Jan. 17, 1995 [JP] Japan .................................. 7-022247
Apr. 11, 1995 [JP] Japan .................................. 7-109169

[51] Int. Cl.⁶ .................................................. G01B 11/24
[52] U.S. Cl. .............................. 364/468.01; 395/183.22
[58] Field of Search .................. 364/167.01, 468.01, 364/481, 551.01, 552, 815, 917, 917.1; 395/183.22

[56] References Cited

U.S. PATENT DOCUMENTS

| | | | |
|---|---|---|---|
| 3,824,558 | 7/1974 | Koshiba | 395/183.22 |
| 4,434,489 | 2/1984 | Blyth | 395/183.22 |
| 4,454,585 | 6/1984 | Ele | 364/507 |
| 5,513,099 | 4/1996 | Schein | 364/167.01 |

FOREIGN PATENT DOCUMENTS

| | | |
|---|---|---|
| 0 214 030 A2 | 11/1987 | European Pat. Off. . |
| 0 304 943 A2 | 3/1989 | European Pat. Off. . |
| 2 184 877 | 7/1987 | United Kingdom . |

*Primary Examiner*—James P. Trammell
*Assistant Examiner*—Craig Steven Miller
*Attorney, Agent, or Firm*—Morrison & Foerster LLP

[57] ABSTRACT

A method and device for supporting the repair of defective portions of a substrate when the defective portions have been discovered during an inspection process. A recorder records defective data associated with the defective portions. A data sorter sorts the defective data by grouping together defective data relating to a same type of defect. A data indicator highlights a defective location on the substrate where the defective portions were found in an order determined by defective data relating to the same type of defect or in an order determined by defective data relating to defects requiring the same type of repair. The data indicator also indicates the type of repair required and the tools to be used in the repair of the defective portions.

20 Claims, 34 Drawing Sheets

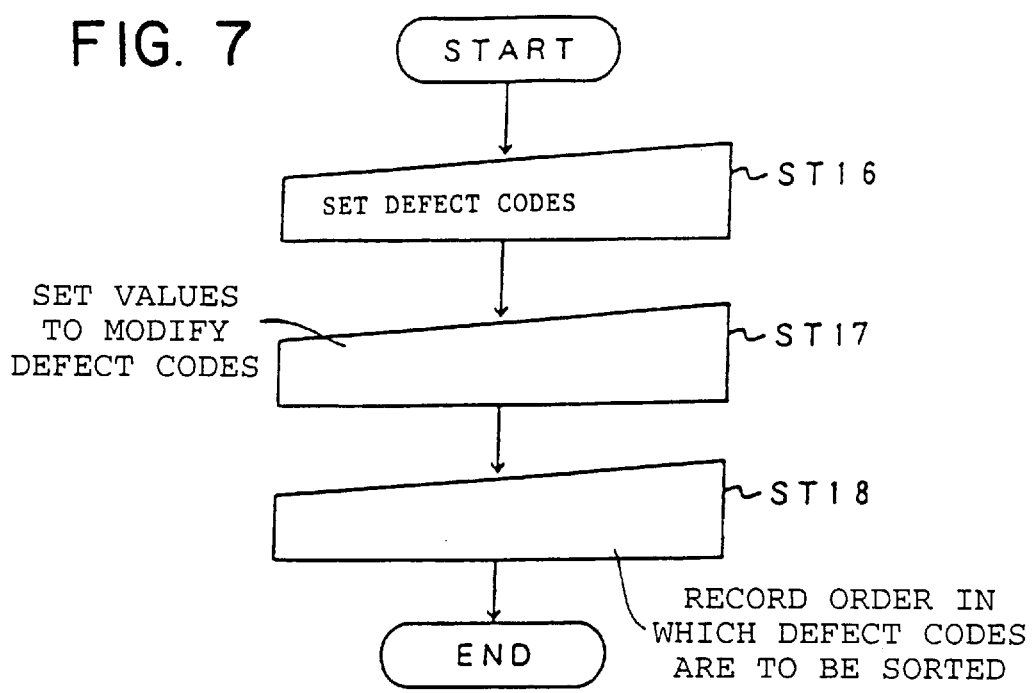
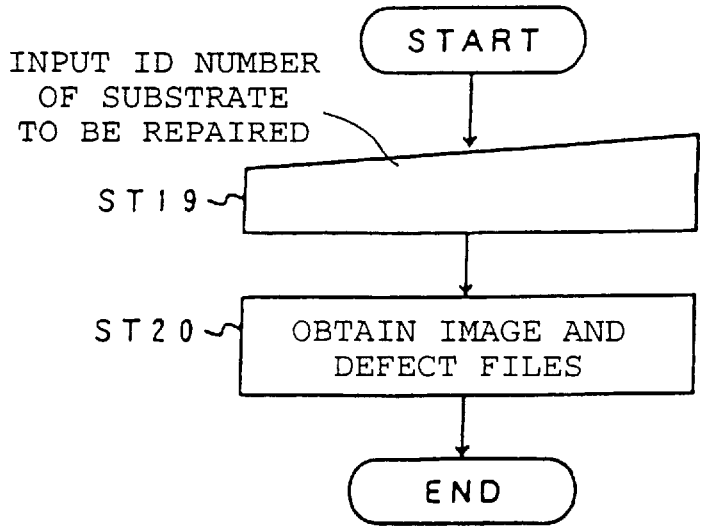

FIG. 16(a)

| PART NUMBER | ID NUMBER | TYPE OF PART | X COOR-DINATE | Y COOR-DINATE | DEFECT CODE |
|---|---|---|---|---|---|
| 0035 | R024 | R1608 | 090000 | 050000 | 07 |
| 0036 | R025 | R1608 | 093000 | 050000 | 01 |
| 0038 | C008 | C2125 | 120000 | 055000 | 0D |
| 0052 | TR1 | TR3P | 070000 | 120000 | 07 |
| 0103 | IC3-22 | 0.8QFP | 320000 | 250000 | 0B |
| 0104 | IC3-30 | 0.8QFP | 326000 | 250000 | 0A |
| ⋮ | ⋮ | ⋮ | ⋮ | ⋮ | ⋮ |

FIG. 16(b)

| PART NUMBER | ID NUMBER | TYPE OF PART | X COOR-DINATE | Y COOR-DINATE | DEFECT CODE | CONVERTED DEFECT CODE |
|---|---|---|---|---|---|---|
| 0036 | R025 | R1608 | 093000 | 050000 | 01 | 2. NO SOLDER |
| 0035 | R024 | R1608 | 090000 | 050000 | 07 | 3. BRIDGE |
| 0052 | TR1 | TR3P | 070000 | 120000 | 07 | 3. BRIDGE |
| 0103 | IC3-22 | 0.8QFP | 320000 | 250000 | 0B | 1. MISSING COMPONENT |
| 0038 | C008 | C2125 | 120000 | 055000 | 0D | 6. OTHER |
| 0104 | IC3-30 | 0.8QFP | 326000 | 250000 | 0A | 6. OTHER |
| ⋮ | ⋮ | ⋮ | ⋮ | ⋮ | ⋮ | ⋮ |

FIG. 16(c)

| PART NUMBER | ID NUMBER | TYPE OF PART | X COOR-DINATE | Y COOR-DINATE | DEFECT CODE | CONVERTED DEFECT CODE | |
|---|---|---|---|---|---|---|---|
| 0036 | R025 | R1608 | 093000 | 050000 | 05 | 2. NO SOLDER | ✳ |
| 0035 | R024 | R1608 | 090000 | 050000 | 01 | 3. BRIDGE | ✳✳ |
| 0052 | TR1 | TR3P | 070000 | 120000 | 02 | 3. BRIDGE | ✳ |
| 0103 | IC3-22 | 0.8QFP | 320000 | 250000 | 07 | 1. MISSING COMPONENT | − |
| 0038 | C008 | C2125 | 120000 | 055000 | 04 | 6. OTHER | − |
| 0104 | IC3-30 | 0.8QFP | 326000 | 250000 | 0A | 6. OTHER | − |
| ⋮ | ⋮ | ⋮ | ⋮ | ⋮ | ⋮ | ⋮ | ⋮ |

| SET REPAIR AND TOOL SELECT TYPE OF COMPONENT |
|---|
| 01 R1608 |
| 02 R2125 |
| 03 R3216 |
| 04 C1608 |
| 05 C2125 |
| 06 C3216 |
| 07 TR3P |
| 08 TR4P |
| 09 POWER-TR |
| 10 MINI-TR |
| 11 SOP1 |
| 12 SOP2 |
| 13 0.50FP |
| 14 0.650FP |
| 15 0.80FP |
| 16 READ |

OK   CANCEL

| SET REPAIR AND TOOL FOR R1608 | | |
|---|---|---|
| | REPAIR | TOOL |
| 01 NOT MUCH FRET | APPLY SOLDER | NARROW SOLDERING IRON |
| 02 NOT ENOUGH FRET | APPLY SOLDER | NARROW SOLDERING IRON |
| 03 TOO MUCH FRET | REMOVE SOLDER | NARROW SOLDERING IRON, SOLDER SUCKER |
| 04 FLAT FRET | REMOVE SOLDER | NARROW SOLDERING IRON |
| 05 FLAT CENTER | REMOVE SOLDER | NARROW SOLDERING IRON, SOLDER SUCKER |
| 06 NO SOLDER | APPLY SOLDER | NARROW SOLDERING IRON |
| 07 BRIDGE | CUT BRIDGE | NARROW SOLDERING IRON |
| 09 NO ELECTRODE | ADD COMPONENT | NARROW SOLDERING IRON, PINCETTE, COMPONENT |
| 0B MISSING COMPONENT | ADD COMPONENT | NARROW SOLDERING IRON, PINCETTE, COMPONENT |
| 0C WRONG COMPONENT | CHANGE COMPONENT | NARROW SOLDERING IRON, PINCETTE, COMPONENT |
| 0D WRONG POSITION | CORRECT POSITION | NARROW SOLDERING IRON, PINCETTE |

OK   CANCEL

```
SET REPAIR TIME

LIMIT FOR REPAIR TIME    120 SECONDS
─────────────────────────────────────
    1. MISSING COMPONENT    20 SECONDS
    2. NO SOLDER            10 SECONDS
    3. BRIDGE               10 SECONDS
    4. TOO MUCH SOLDER       5 SECONDS
    5. WRONG COMPONENT      15 SECONDS
    6. OTHER                20 SECONDS

[ OK ]    [ CANCEL ]
```

FIG. 39

| ID NO. OF SUBSTRATE | TOTAL REPAIR TIME IN SECONDS | REPAIR COMPLETED |
|---|---|---|
| A1004 | 15 | * |
| A1003 | 25 | * |
| A1007 | 25 | − |
| A1000 | 60 | − |
| A1006 | 90 | − |
| ▽ A1005 | 125 | − |
| ▽ A1001 | 150 | − |
| ▽ A1002 | 160 | − |

FIG. 42

| PART NUMBER | PART ID CODE | TYPE OF COMPONENT | X COORDI-NATE OF COMPONENT | Y COORDI-NATE OF COMPONENT | DEFECT CODE |
|---|---|---|---|---|---|
| 0035 | R024 | R1608 | 090000 | 050000 | 07 |
| 0036 | R025 | R1608 | 093000 | 050000 | 01 |
| 0038 | C008 | C2125 | 120000 | 055000 | 0D |
| 0052 | TR1 | TR3P | 070000 | 120000 | 07 |
| 0103 | IC3-22 | 0.8QFP | 320000 | 250000 | 0B |
| 0104 | IC3-30 | 0.8QFP | 326000 | 250000 | 0A |
| ⋮ | ⋮ | ⋮ | ⋮ | ⋮ | ⋮ |
| ↑ | ↑ | ↑ | ↑ | | ↑ |
| 101 | 102 | 103 | 104 | | 105 | ns
METHOD AND DEVICE FOR SUPPORTING THE REPAIR OF DEFECTIVE SUBSTRATES

FIELD OF THE INVENTION

This invention concerns a method and device to support in the repair of defective portions of printed substrates on which various components are mounted, based on evaluation data obtained by inspecting those substrates.

BACKGROUND OF THE INVENTION

FIG. 40 illustrates the processes used to produce a substrate on which components are mounted when this invention is implemented. In Process A the components are mounted on the printed substrate; in Process B the components are soldered to the substrate, which is then sent to Process C.

In Process C, the mounting of each component is inspected based on data representing its location on the substrate. This inspection may be performed using a device which allows the appearance of the mounting to be evaluated by an inspector, or it may be performed by an automatic inspection device. In this case, the inspection device will create a defect file containing the result of the inspection for each substrate. A substrate with mounting defects will be sent with its defect file to Process D.

In Process D, the portions to be repaired are indicated, one by one, by the device to support in the repair, based on the aforesaid defect file. Each defect is repaired by hand according to the said indications.

The device to inspect substrates by eye consists of an X-axis table, a Y-axis table, an imaging unit, an illumination unit and a control processing unit. This control processing unit consists of a display, an input unit, a memory, a floppy disk drive and a control unit.

The X and Y-axis tables move the substrate in directions X and Y according to commands from the control unit so that portions of it can be successively imaged by the imaging unit.

The imaging unit successively images portions of the substrate. The illumination unit regulates the illumination of the vicinity around the component to be imaged according to commands from the control processing unit. The image signals outputted by the imaging unit are transmitted to the display by way of the control unit. The display unit displays the image of the component to be inspected.

The input unit is used to input the type of substrate being inspected, its ID number and the result of the evaluation of the component being inspected. The memory stores the data files needed to scan the components to be inspected. These files give the order in which the components are to be scanned.

The control unit reads out from the memory the data file containing the scanning order corresponding to the type of substrate which was inputted. Based on this scanning data file, it controls the X and Y-axis tables, the imaging unit and the illumination unit. For each substrate, it creates a defect file containing the result of the evaluation of each component input via the input unit and an image file showing the defective component on a layout diagram of all components to be inspected. It writes these defect and image files onto a floppy disk, and the disk drive causes the contents of these files to appear on the display.

FIG. 41 is a flowchart of a visual inspection.

In Step 501, the identification of the substrate to be inspected (i.e., what type of substrate) is inputted by the operator. In Step 502, the control unit reads out of the memory the scanning file corresponding to the identification which was inputted.

In Step 503 the operator sets the substrate on the stage and in Step 503a he inputs its ID number. In Step 504, the control unit operates the X and Y-axis tables, images the first component and displays its image on the screen.

In Step 505, the operator views the image of the component on the display. If there is a soldering defect, he inputs a defect code in Step 506.

If in Step 507 the inspection of every component has not yet been completed, the image of the next component to be inspected is displayed in Step 508. We return to Step 505 and repeat the visual inspection. If in Step 507 all components have been inspected, a defect file is created in Step 509 for the substrate which has just been inspected. The contents of this file are displayed on the screen and an image file is created.

In Step 510 the substrate which was inspected is removed from the stage, and the inspection is over.

FIG. 42 illustrates how the data are configured in the defect file created by the visual inspection device. Here component numbers 101 are given in the order of inspection. Component identification 102 is the identification code used by the inspection device for each component. Component class 103 is a code indicating the component's size, rating, etc. Coordinates 104 indicate the coordinates of the component's location on the substrate. Defect code 105 indicates the type of defect found in the visual inspection.

FIG. 43 is a block diagram giving a sample configuration of an existing device to support in the repair of defective substrates. A floppy disk on which is stored the defect file for the substrate to be repaired is loaded in disk drive 107.

When the operator uses input unit 106 to enter the ID number of the substrate to be repaired, control unit 108 reads the defect file for that ID number out of floppy disk drive 107. The identification and class code, X and Y coordinates and defect code for the first defective component are shown on display 109.

The operator finds the defective component shown on the screen, repairs it, and enters via input unit 106 the fact that the repair has been completed. When the control unit receives the signal indicating that the repair has been completed, it displays the description of the defect for the second defective component in the defect file. The operator proceeds to repair this defect just as he did the first one.

With an existing device to support in the repair of substrates, the result of the inspection by a visual inspection device is displayed on the screen, and the operator is given directions as to the location of the repair and the method which should be used.

With the existing method and device to support in the repair of substrates as described above, the defective components are displayed in the same order in which they were discovered in the inspection performed by the visual inspection device. For this reason, various defect phenomena (corresponding to different defect codes) are displayed in random order. The operator might need a soldering iron to repair the first component, change to a solder sucker to repair the next, and change back to a soldering iron to repair the third. This makes the repair of defective portions inefficient.

In addition, an inexperienced operator might choose a tool which is inappropriate for the type of repair which needs to be done or he might require a period of time to make the choice.

Another problem is that for each repair, the substrate must be moved from the imaging site to the repair site. The operator must then locate on the actual substrate the defective component which he sees on the screen, which requires time and labor.

If a substrate requires an inordinate amount of time to repair, it would sometimes be more efficient, from the point of view of cost, not to repair it.

SUMMARY OF THE INVENTION

This invention addresses the difficulties of prior art devices discussed above. Its objective was to provide a method and device to support in the repair of substrates which would allow the repairs to be performed more efficiently.

In order to achieve the objective stated above, the method to support in the repair of substrates according to this invention includes: a process in which data concerning defective portions of the substrate which were created during the inspection process are stored in a storage device; a process in which the aforesaid defect data are sorted by a data sorting device into sets of data representing the same sort of defect or the same sort of required repair; and a process in which an indicating device points out the locations of defects on the substrate in the order determined by sorting the data in the aforesaid sorting process. The device to support in the repair of substrates according to this invention includes: a device to store data concerning defective portions of the substrate which were created by the inspection device; a device to sort the aforesaid defect data into sets of data representing the same sort of defect or the same sort of required repair; and a device to point out the locations of defects on the substrate in the order determined by the aforesaid data sorting device.

In another method to support in the repair of substrates, the aforesaid process of indicating the locations of defects entails the following. A spot on the substrate where a defect is to be highlighted is moved into highlighting position by a positioner, and the location of the defect on the substrate is indicated by projecting a spotlight onto the defective portion. The device to support in the repair of substrates is equipped with a device to move the substrate so as to successively position each defective part in the order determined when the data were sorted by the aforesaid sorting device. The aforesaid indicating device points out the defective part moved by the positioner into the aforesaid highlighting position by projecting a spotlight onto it.

In another method to support in the repair of substrates, the aforesaid indicating process consists of highlighting the location of each defect on the substrate in the order determined by the aforesaid data sorting process, and consists also of specifying the type of repair to be performed and the tool to be used. In the device to support in the repair of substrates, the aforesaid indicating device highlights the location of each defect on the substrate in the order determined by the aforesaid data sorting process and also specifies the type of repair to be performed and the tool to be used.

In still another method to support in the repair of substrates, after the aforesaid data recording process has been completed, the data associated with the defective portions of the aforesaid substrates are used to calculate, for each substrate, the total repair time it will require. Codes are then displayed identifying the substrates in the order of their repair time, beginning with the shortest time required. A warning is issued for any substrate whose total repair time exceeds a previously established limit. The device to support in the repair of substrates calculates the total repair time which will be needed for each board, and displays codes identifying the substrates in the order of their repair time, beginning with the shortest time required. It also has an evaluation device which issues a warning for any substrate whose total repair time exceeds a previously established limit.

With the method and device of this invention, then, data representing defective portions of a substrate are recorded and the recorded defect data are sorted according to type of defect or type of repair needed. The locations of the defects on the substrate are indicated in the order determined by sorting the data. This enhances the efficiency of the repair operation.

In addition, the locations of defects to be repaired on the substrate are indicated by a spotlight, which allows the substrate to be repaired more efficiently.

Further, the type of repair to be performed and the tool to be used are specified, which allows the substrate to be repaired more efficiently.

In addition, the data associated with the defective portions of the aforesaid substrates are used to calculate, for each substrate, the total repair time it will require. Codes are then displayed identifying the substrates in the order of their repair time, beginning with the shortest time required. A warning is issued for any substrate whose total repair time exceeds a previously established limit. Substrates which would require too much time to repair can be eliminated to improve cost efficiency.

BRIEF DESCRIPTION OF THE INVENTION

FIG. 7 is a subroutine of the flowchart shown in FIG. 6. It shows the order of processing involved in stipulating the sorting conditions.

FIG. 8 is a subroutine of the flowchart shown in FIG. 6. It shows the order of processing involved in reading out the inspection results.

FIGS. 16a–c illustrates how the data may be configured in defect files.

FIG. 16(a) shows how the data are configured in the defect file before being sorted by defect code.

FIG. 16(b) shows how the data are configured in the defect file after being sorted by defect code.

FIG. 16(c) shows how the data are configured in the defect file partway through the repair operation.

Figure 17:
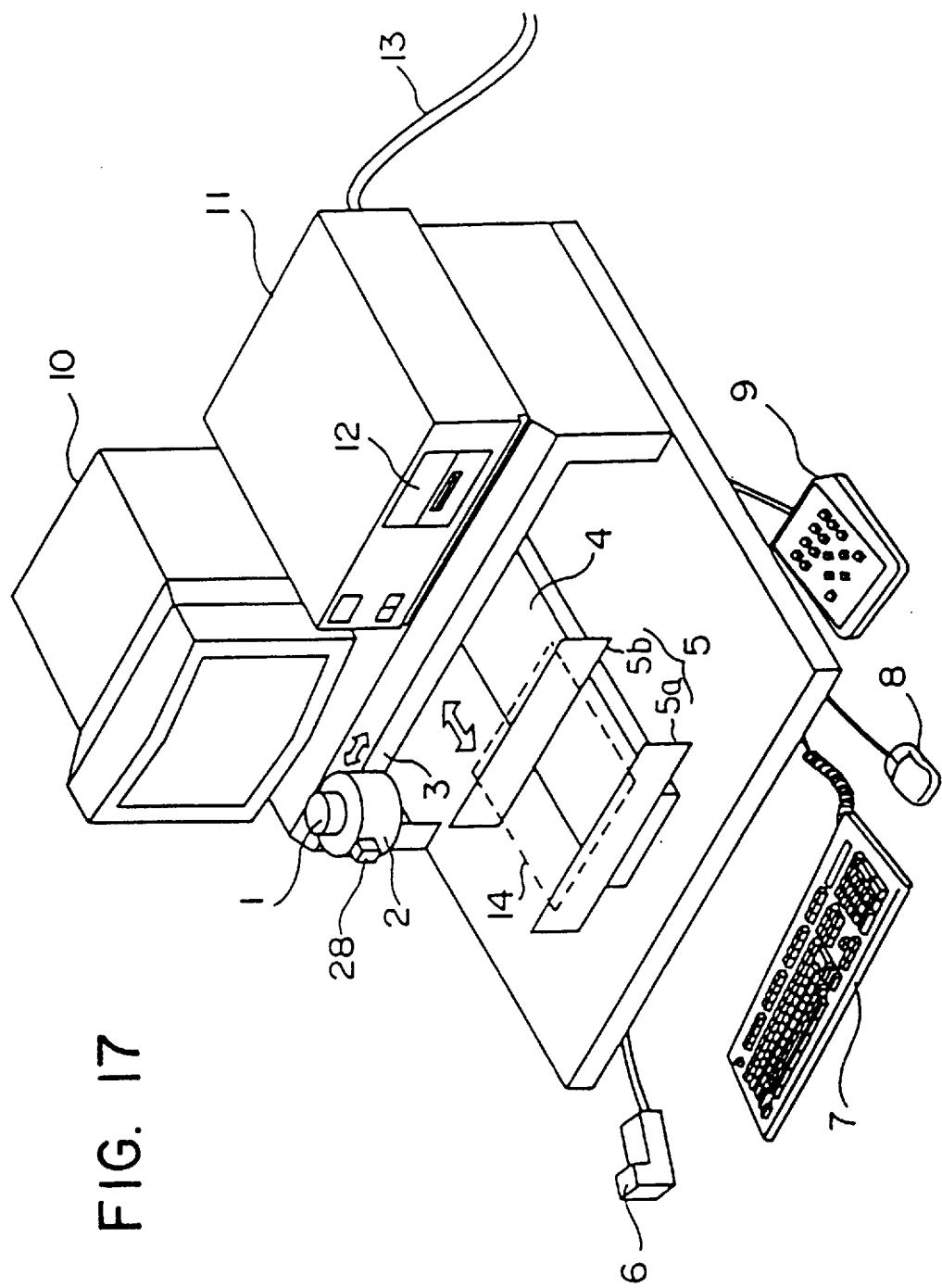

FIG. 17 is a sketch of the second ideal embodiment of this invention.

Figure 18C:
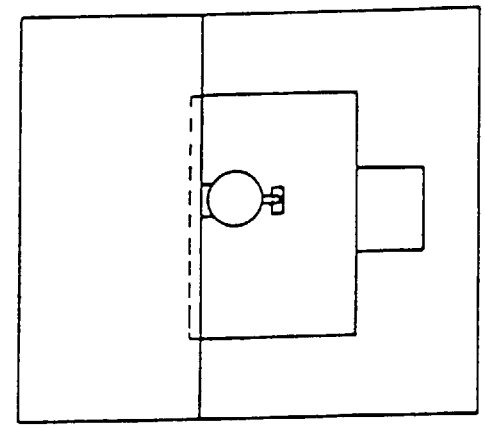
Figure 18B:
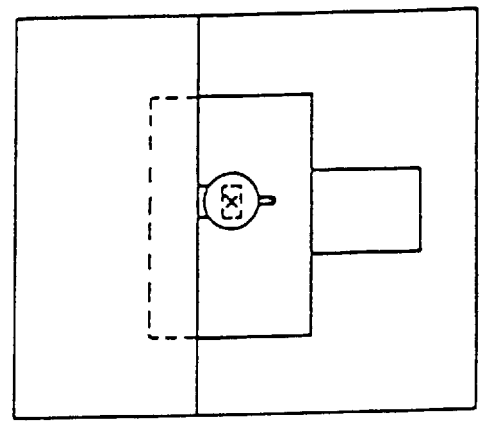
Figure 18A:
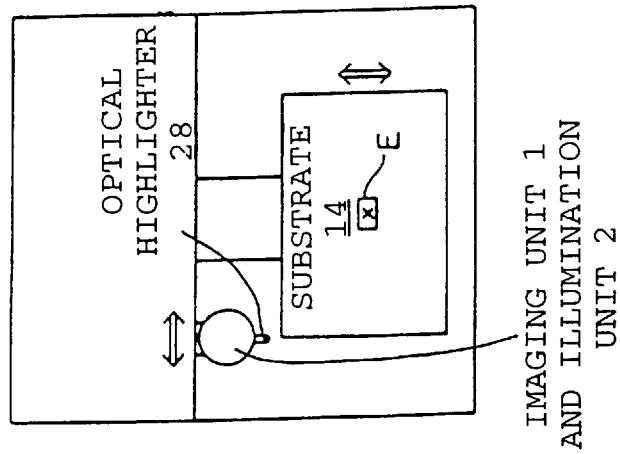

FIG. 18a–c are plan views of the second ideal embodiment of this invention. It shows the positions into which the X and Y tables can be moved.

FIG. 18(a) shows the position in which the substrate is loaded and unloaded and its defective portions are repaired.

FIG. 18(b) shows the position in which the defective portion of the substrate is imaged.

FIG. 18(c) shows the position in which the defective portion of the substrate is highlighted by a spotlight.

Figure 19:
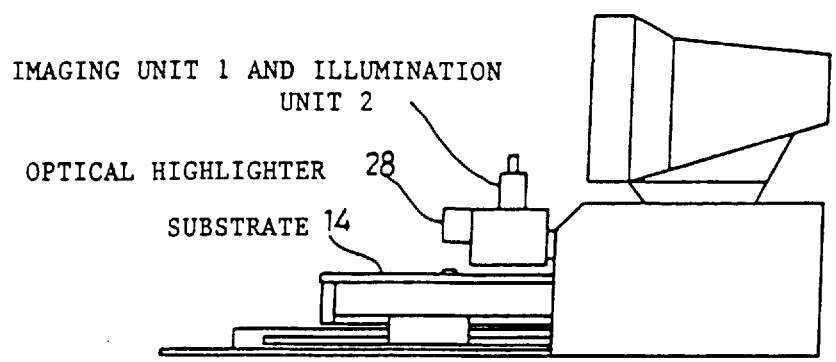

FIG. 19 is a lateral view of the second ideal embodiment of this invention.

Figure 20:
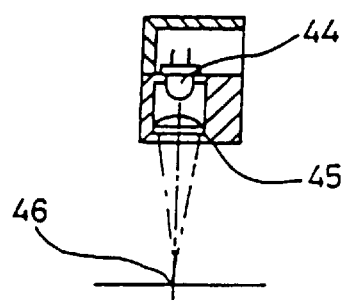

FIG. 20 is a cross section of the optical highlighter.

Figure 21:
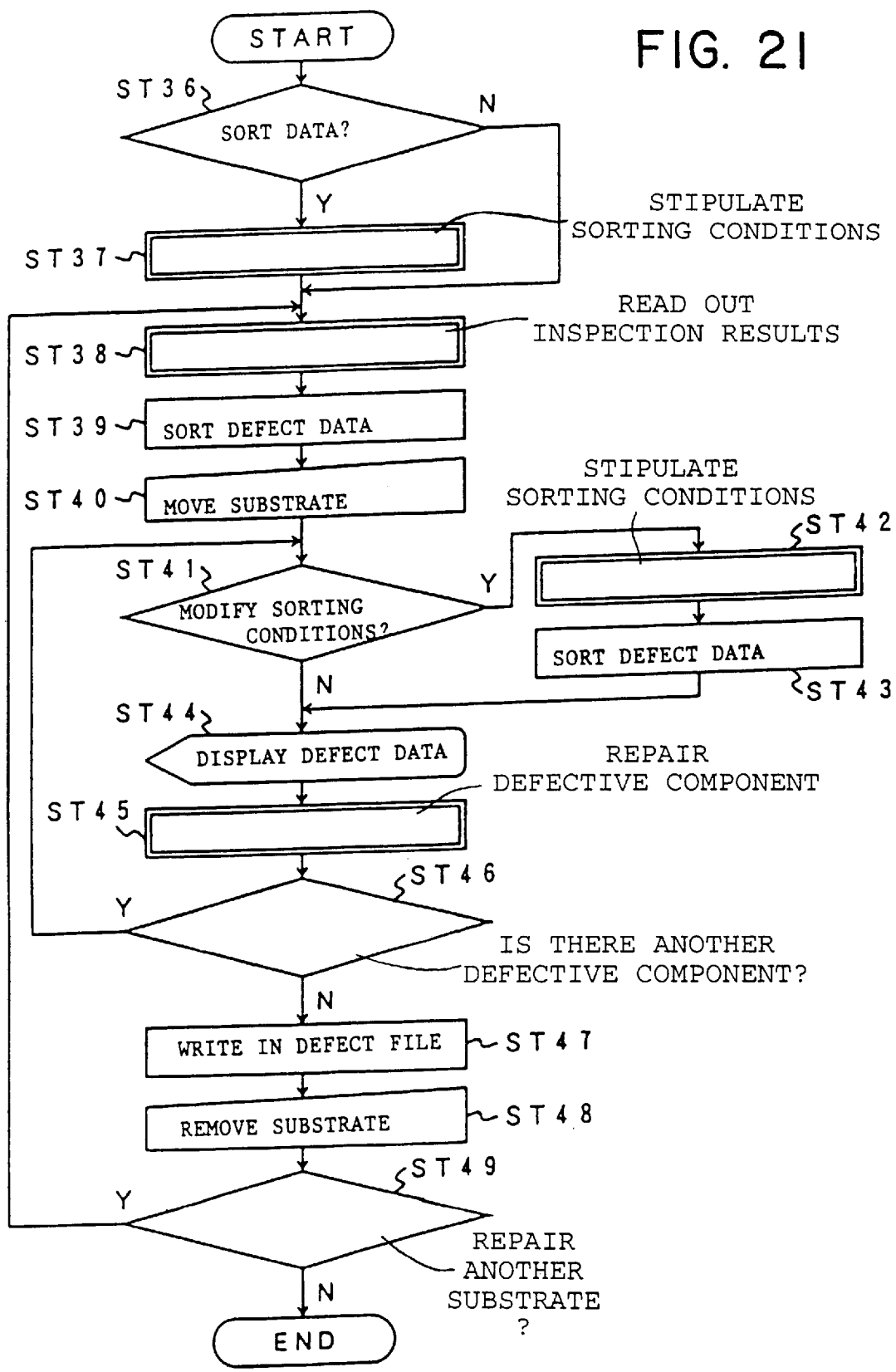

FIG. 21 is a flowchart of the processing executed by the repair device in the second ideal embodiment of this invention.

Figure 22:
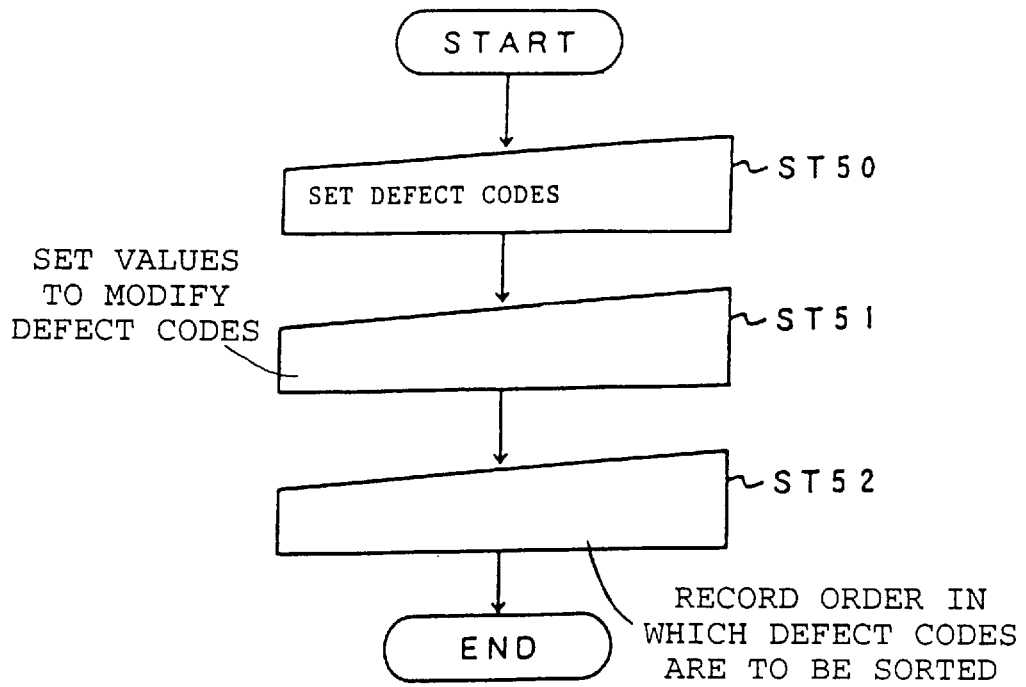

FIG. 22 is a subroutine of the flowchart in FIG. 21. It shows the order of processing executed to stipulate the sorting conditions.

Figure 23:
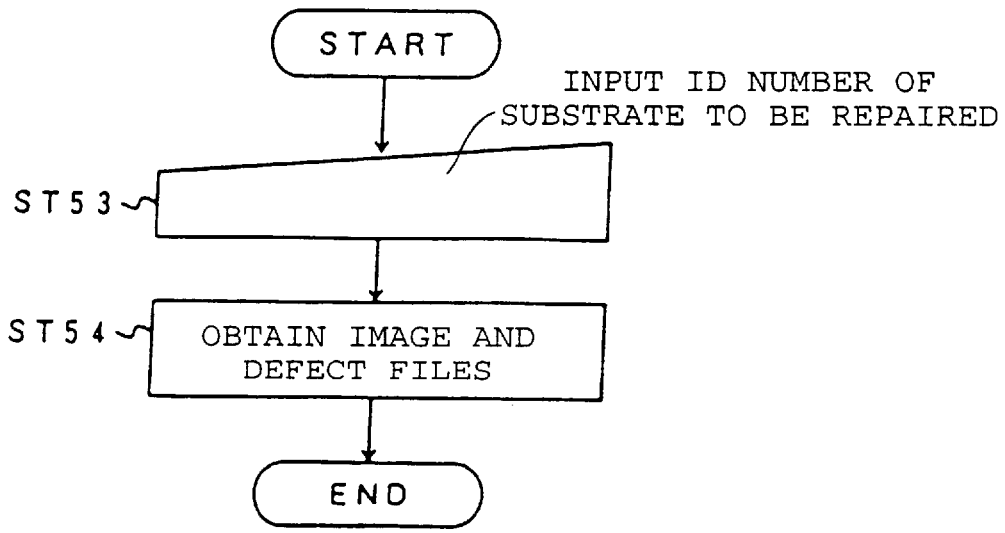

FIG. 23 is a subroutine of the flowchart in FIG. 21. It shows the order of processing executed to read out the inspection results.

Figure 24:
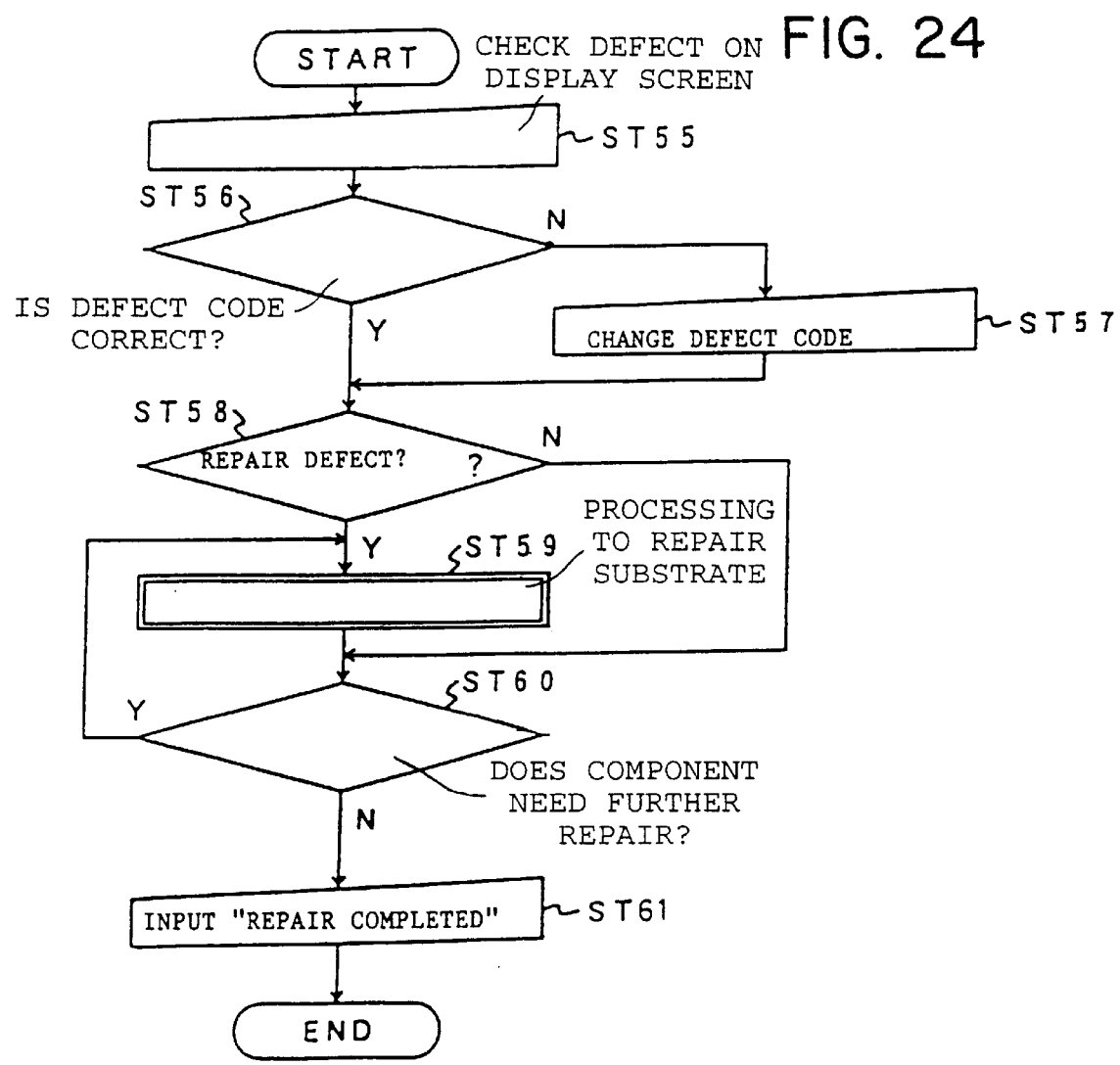

FIG. 24 is a subroutine of the flowchart in FIG. 21. It shows the order of processing executed to repair the substrate.

Figure 25:
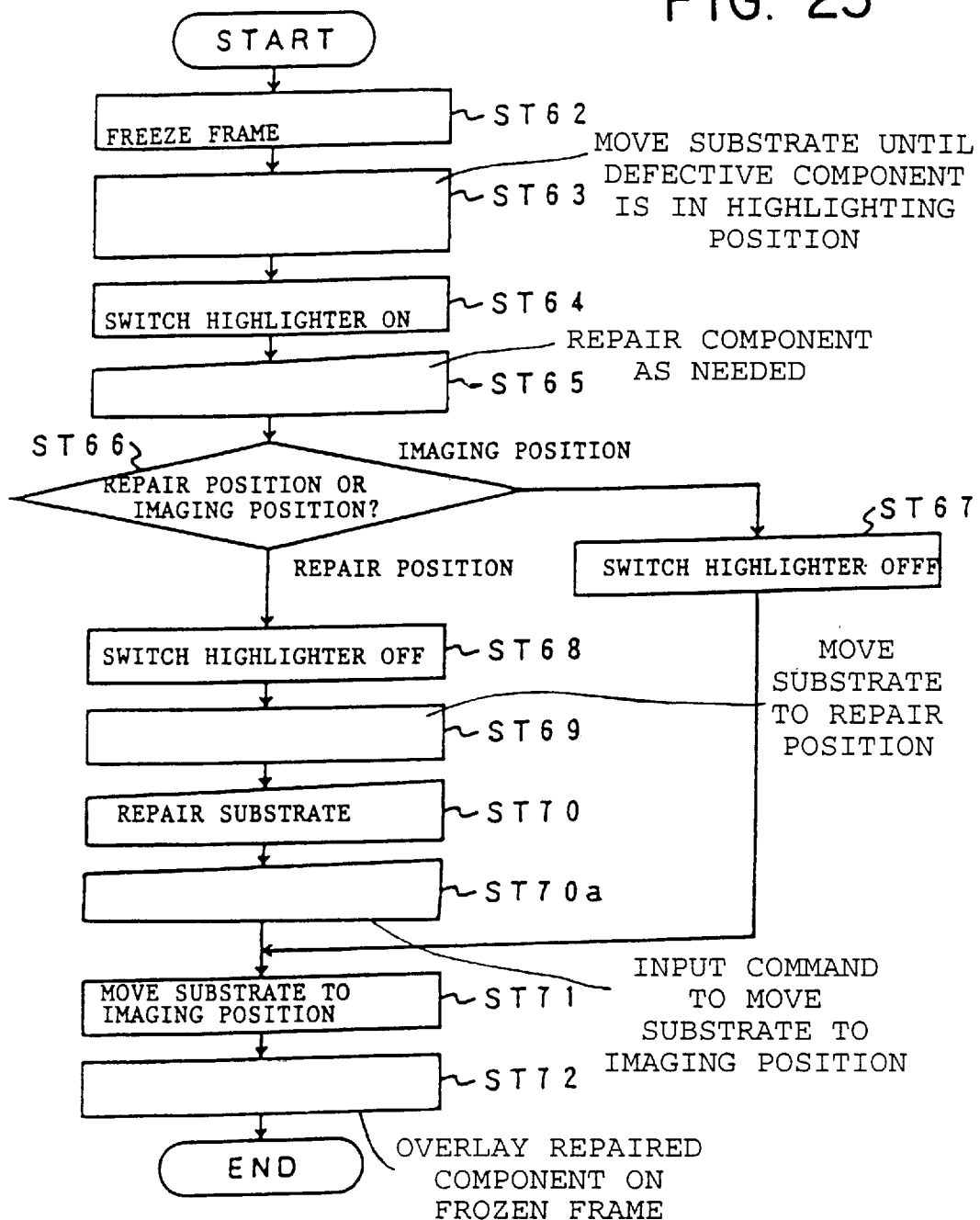

FIG. 25 is a subroutine of the flowchart in FIG. 24. It shows the order of processing executed to repair a defective component.

Figure 26:
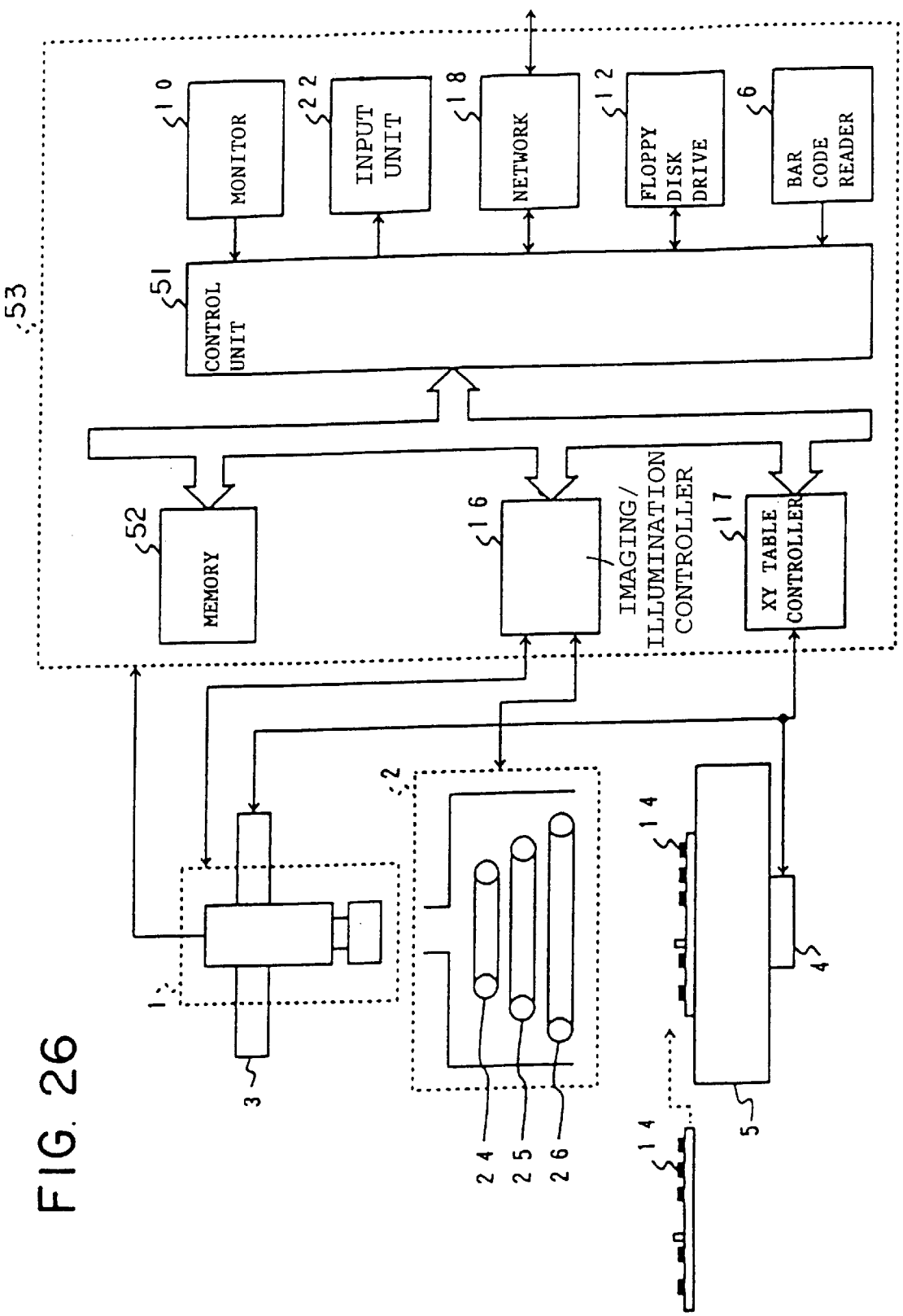

FIG. 26 is a diagram of the overall configuration of the repair device which is the third ideal embodiment of this invention.

Figure 27:
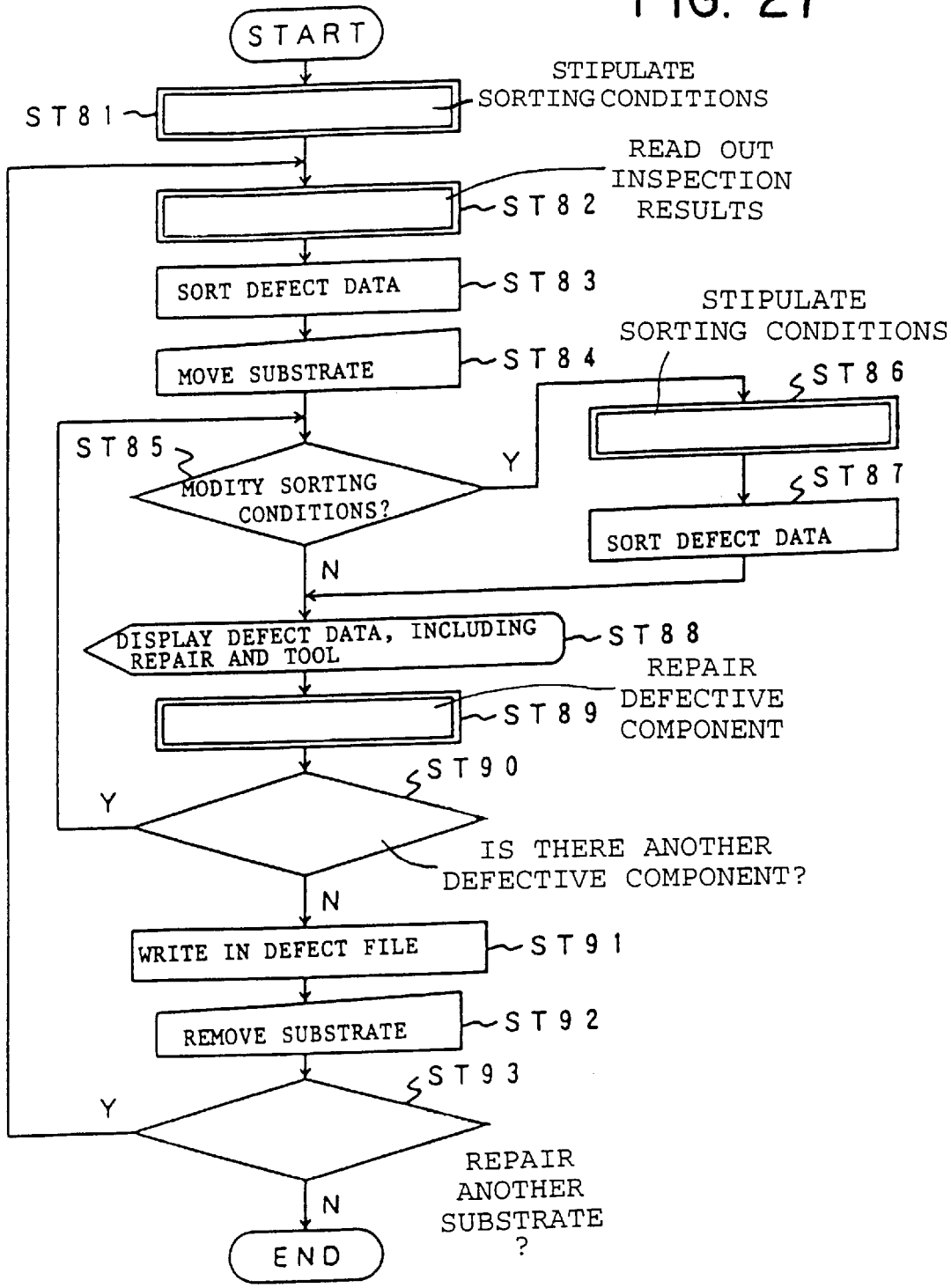

FIG. 27 is a flowchart of the order of processing executed by the repair device in the third ideal embodiment of this invention.

Figure 28:
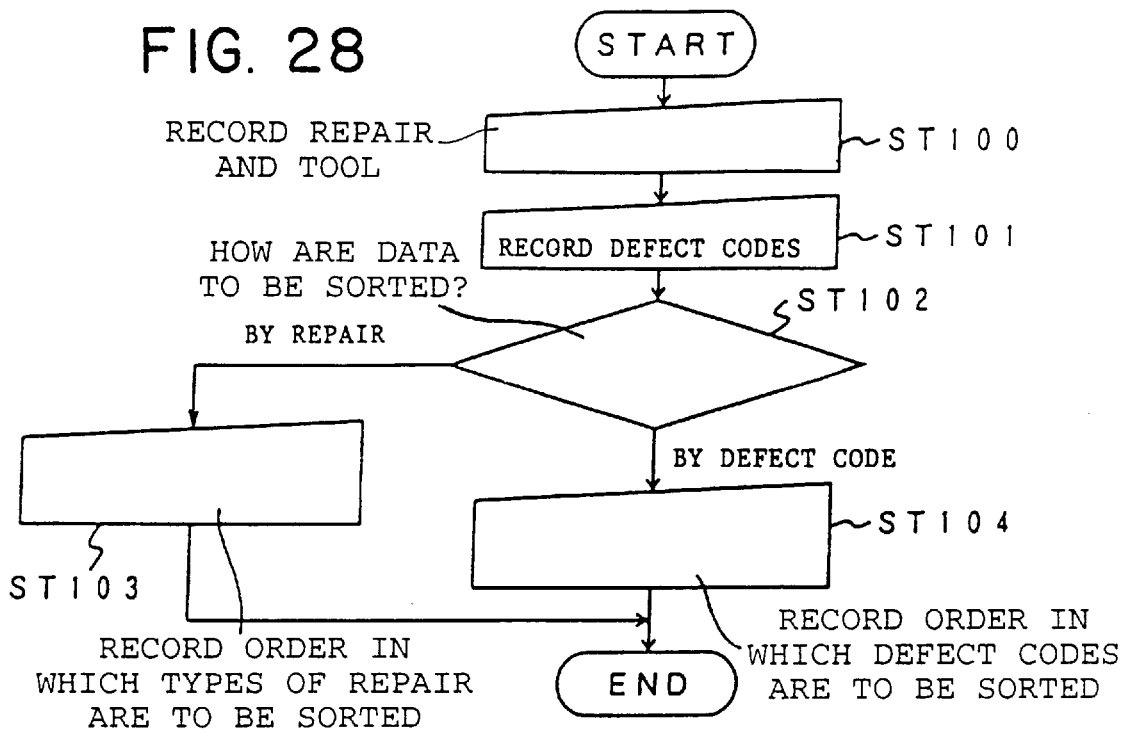

FIG. 28 is a subroutine of the flowchart shown in FIG. 27. It shows the order of processing involved in stipulating the sorting conditions.

Figure 29:
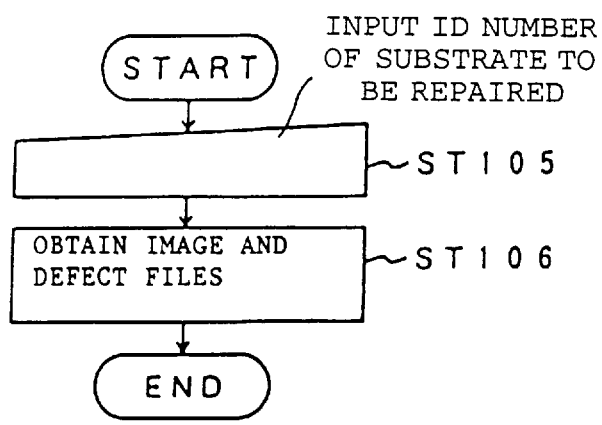

FIG. 29 is a subroutine of the flowchart shown in FIG. 27. It shows the order of processing involved in reading out the inspection results.

Figure 30:
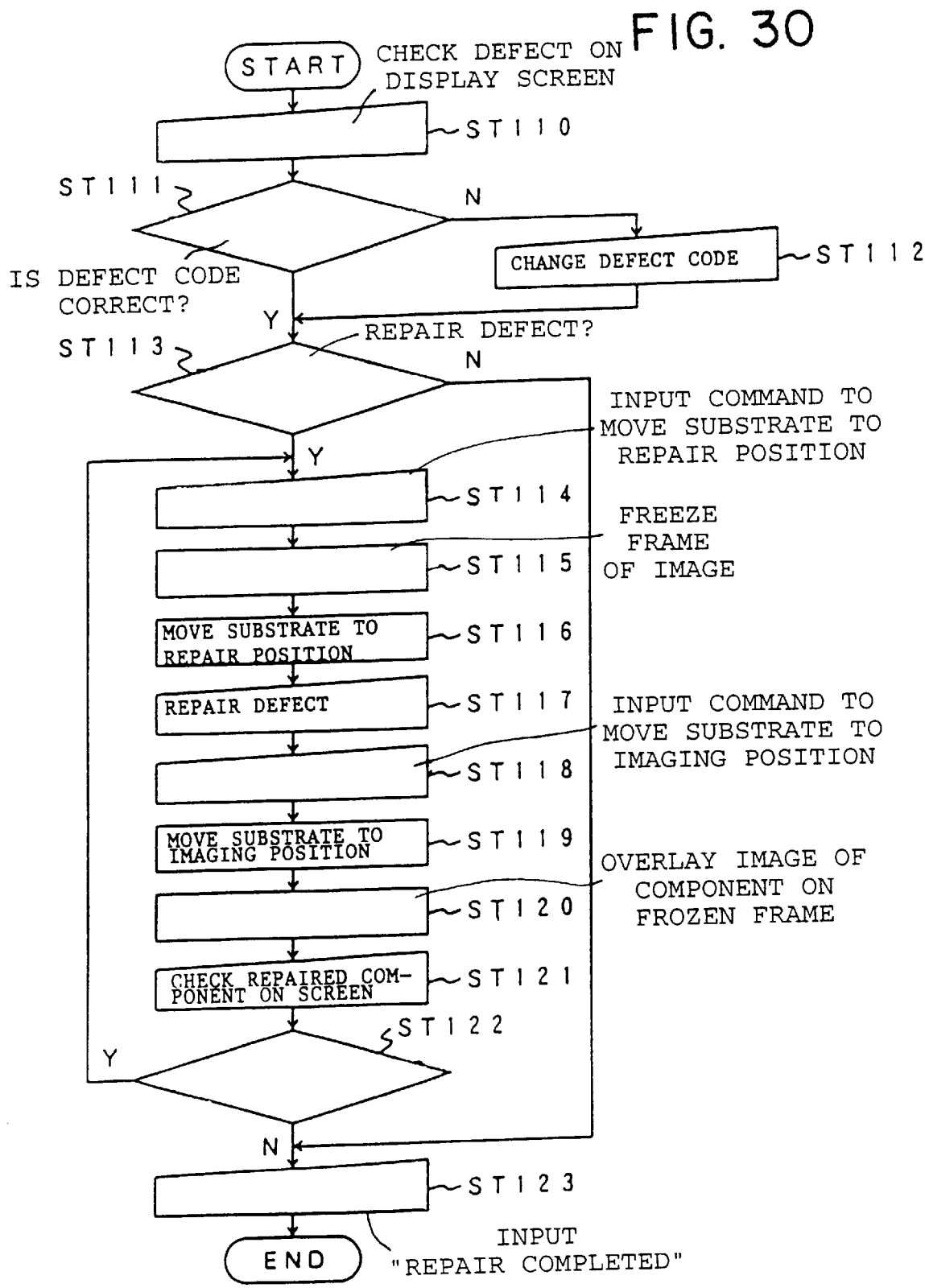

FIG. 30 is a subroutine of the flowchart shown in FIG. 27. It shows the order of processing involved in repairing the substrate.

FIG. 31 shows the screen displayed on the monitor to set the type of repair and the repair tool for each defect code.

Figure 32:
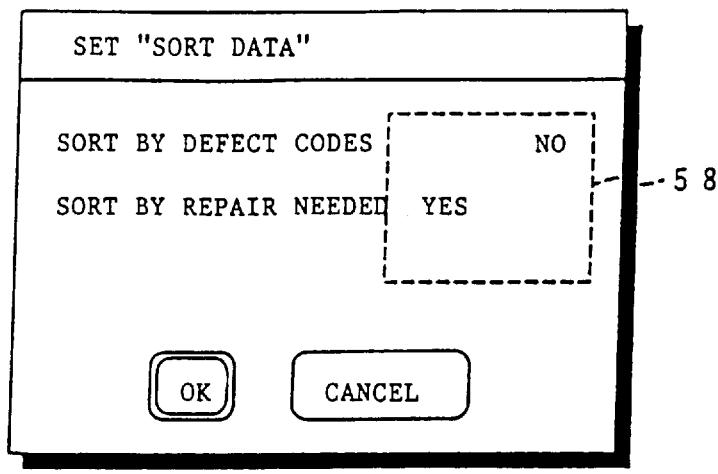

FIG. 32 shows the screen displayed on the monitor to set the method by which the data are to be sorted.

Figure 33:
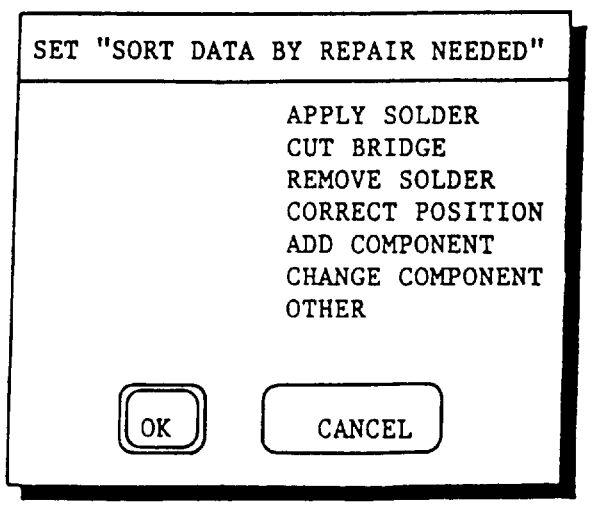

FIG. 33 shows the screen displayed on the monitor to set "Sort Data by Type of Repair Needed."

Figure 34:
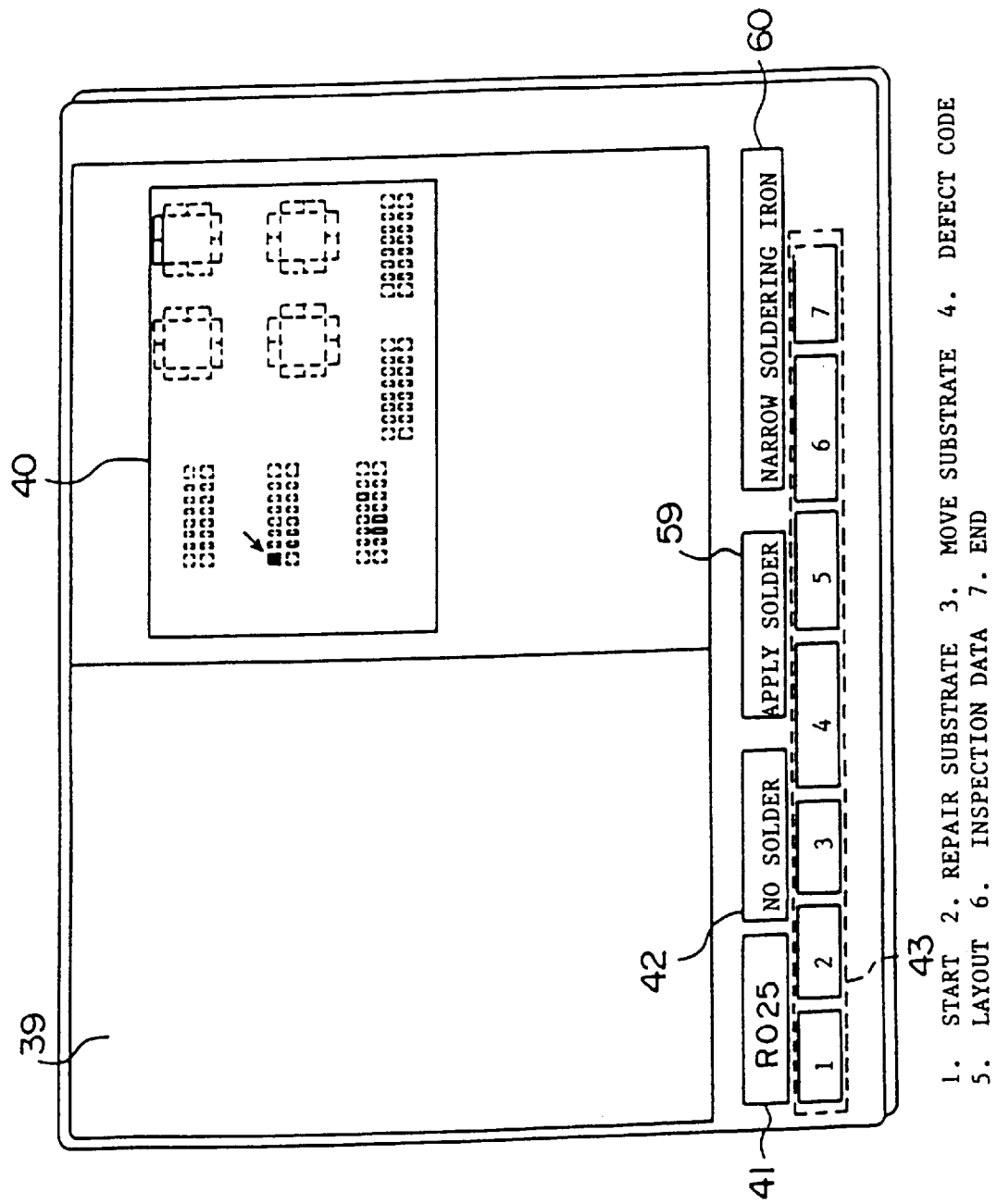

FIG. 34 shows the screen displayed on the monitor in the third ideal embodiment of this invention to show the operator data concerning defective components.

Figure 35:
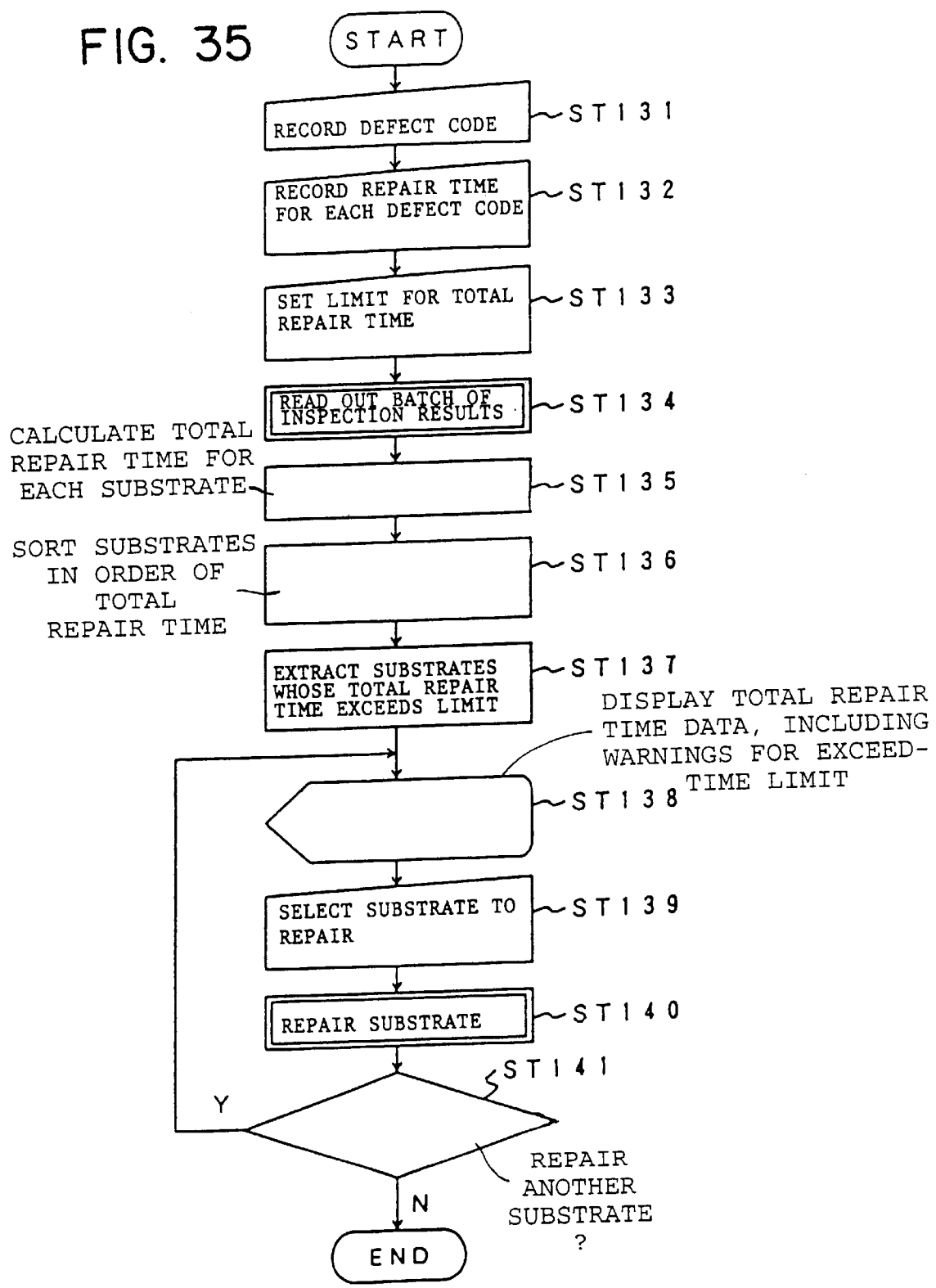

FIG. 35 is a flowchart of the order of processing executed by the fourth ideal embodiment of this invention to produce repair time data.

Figure 36:
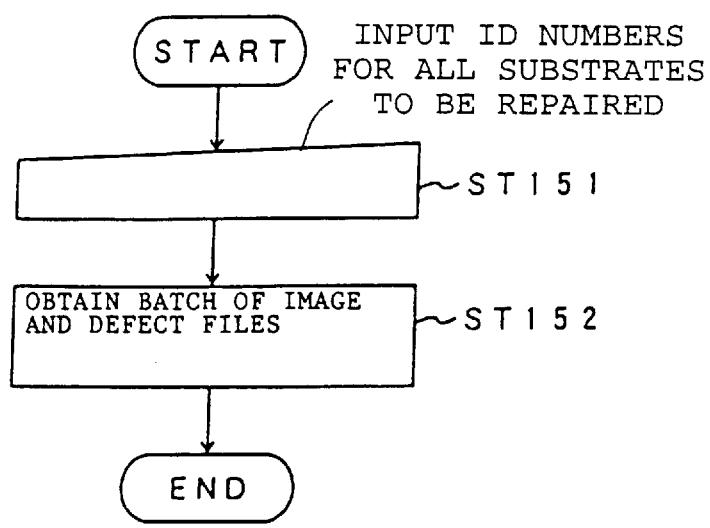

FIG. 36 is a subroutine of the flowchart in FIG. 35. It shows the order of processing involved in reading out a batch of inspection results.

Figure 37:
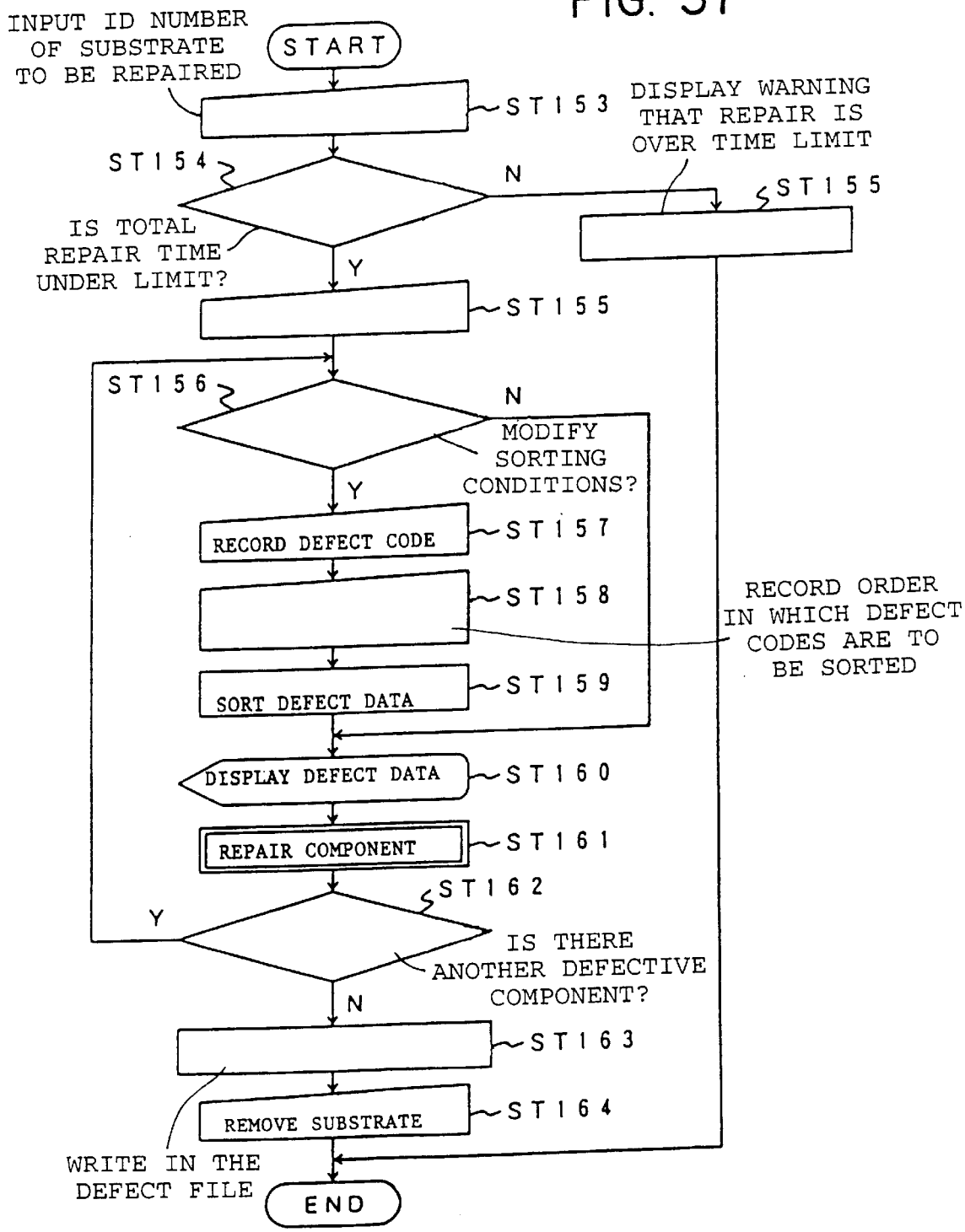

FIG. 37 is a subroutine of the flowchart in FIG. 35. It shows the order of processing executed by the repair device.

FIG. 38 is the screen displayed on the monitor to set a repair time for each defect code.

FIG. 39 is the screen displayed on the monitor to show the operator the repair time data.

Figure 40:
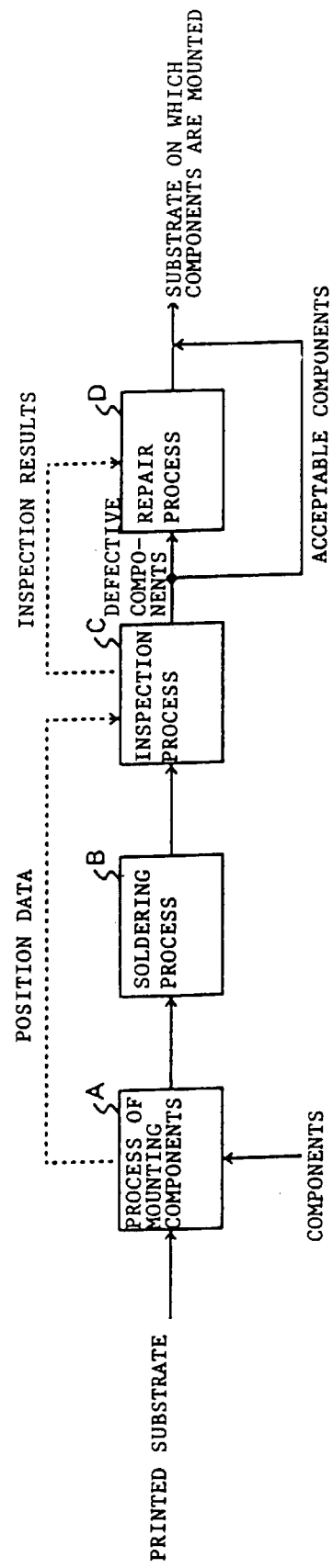

FIG. 40 is a block diagram of the processes involved in producing a substrate with components mounted on it.

Figure 41:
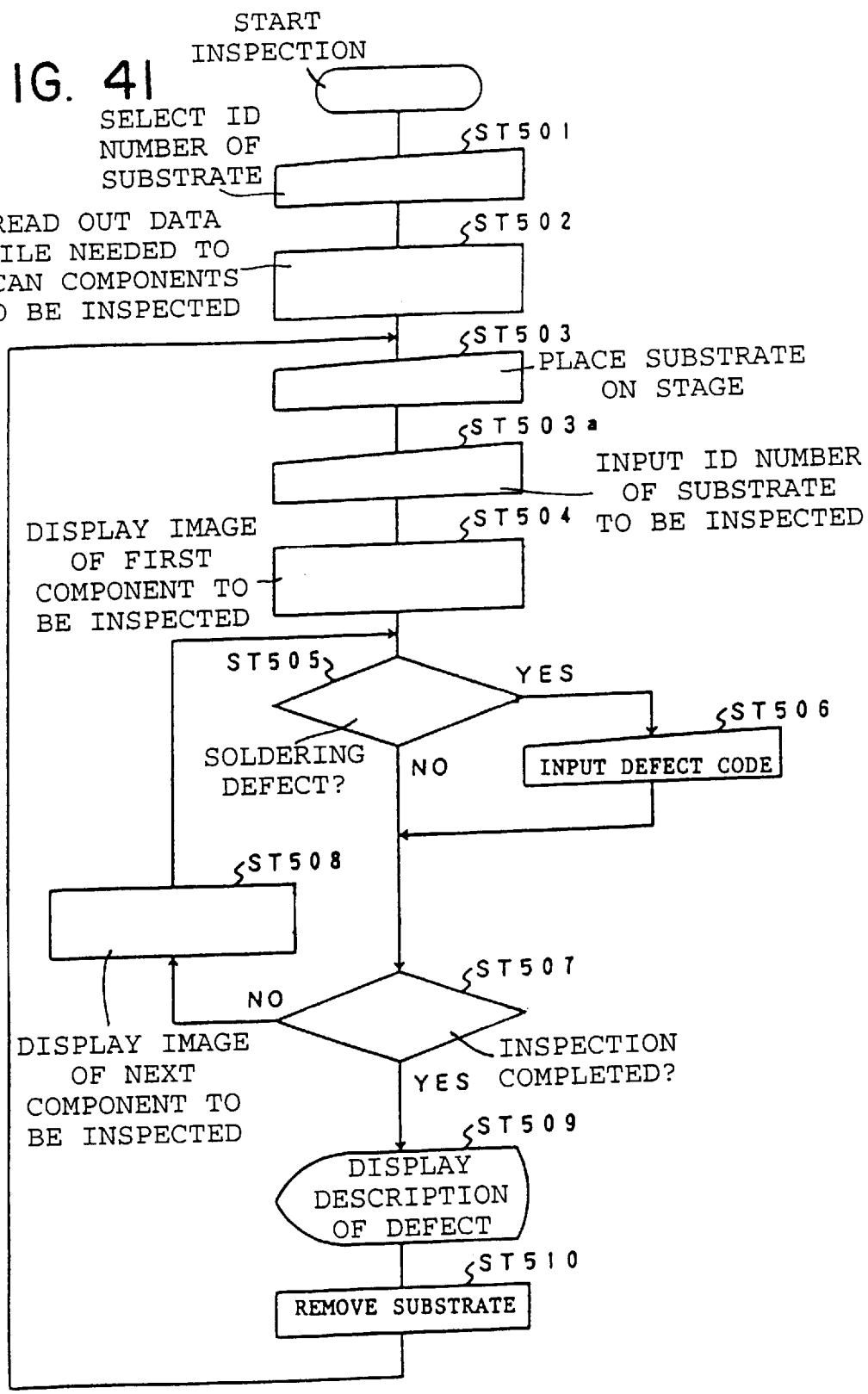

FIG. 41 is a flowchart of the inspection of a substrate by the inspection device.

FIG. 42 shows how the data are configured in the defect file created by the inspection device.

Figure 43:
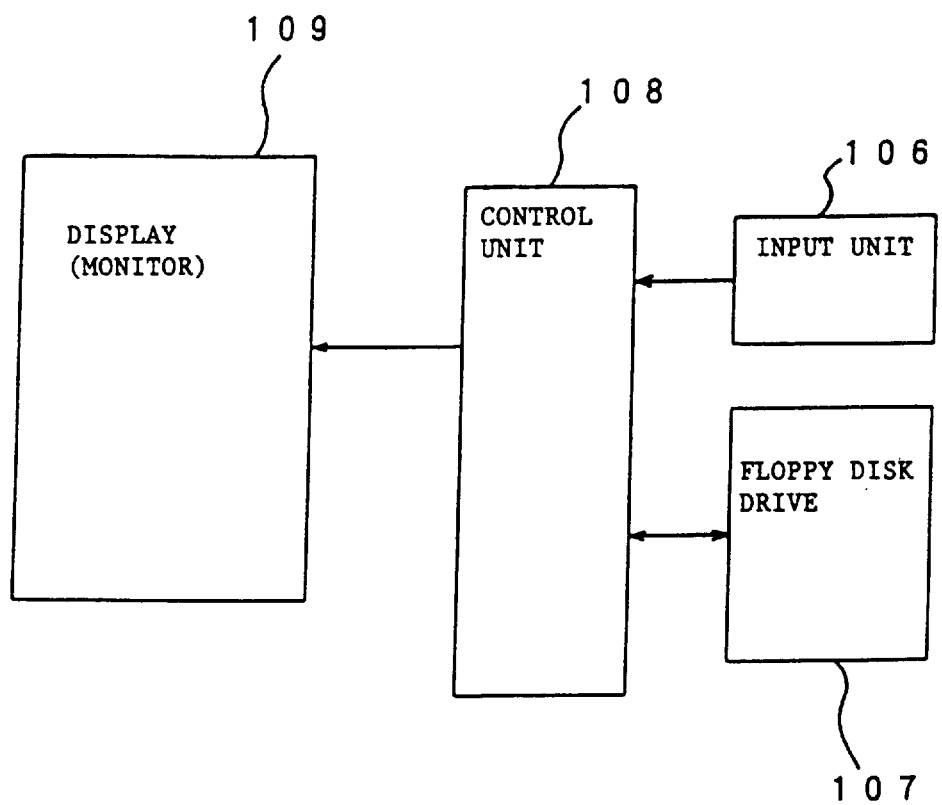

FIG. 43 is a block diagram of the configuration of a device to support in the repair of substrates belonging to the prior art.

DETAIL DESCRIPTION OF THE INVENTION

Figure 1:
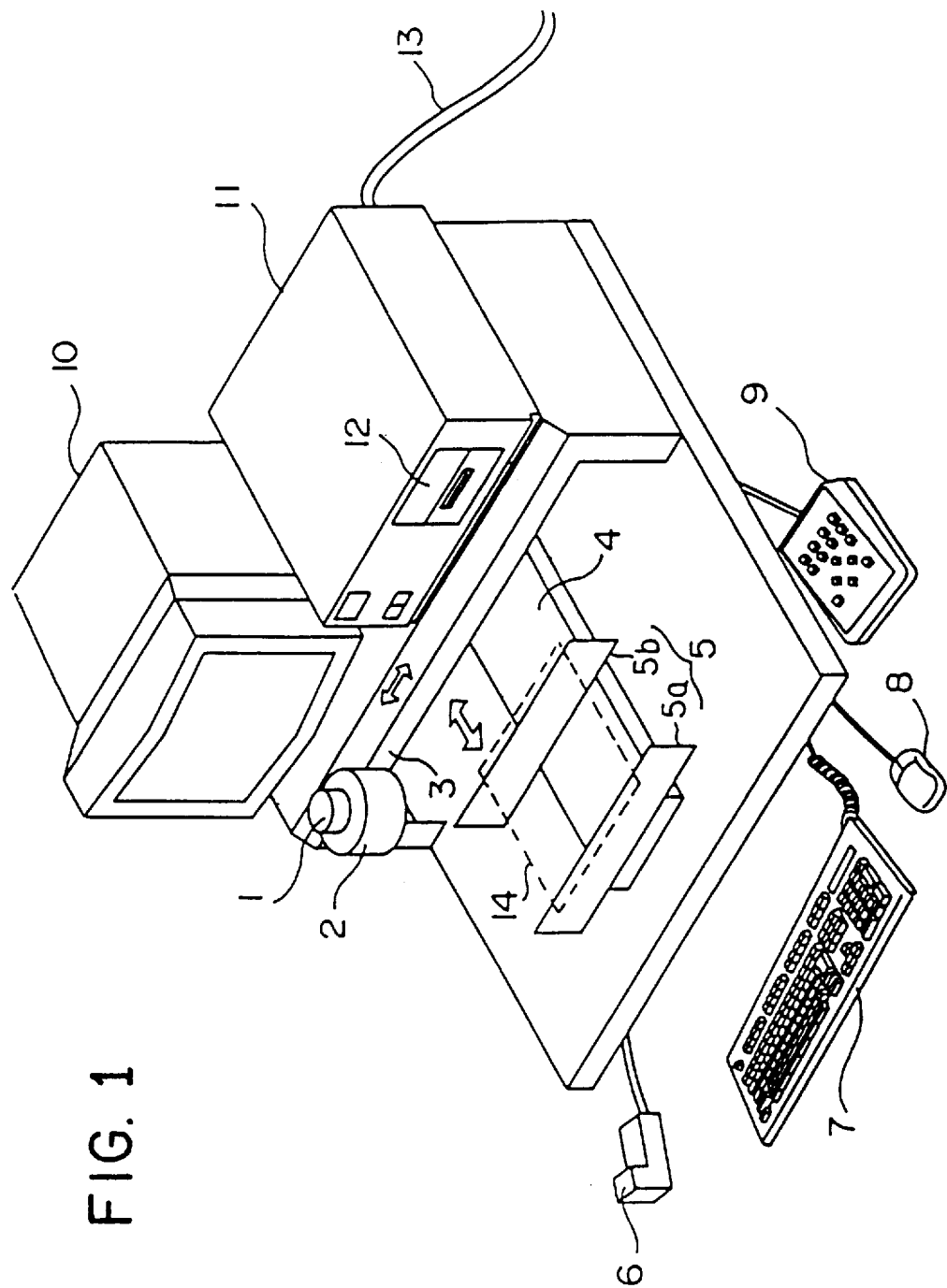
FIG. 1 is a sketch of the first ideal embodiment of this invention.

FIG. 1 is a sketch of our first example of an ideal embodiment of this invention. In this drawing 1 is the imaging unit; 2 is the illumination unit, which illuminates the portion of the substrate which is to be imaged by unit 1; 3 is the X-axis table; 4 is the Y-axis table; 5 is the stage for the substrate; 6 is a bar code reader; 7 is a keyboard; 8 is a mouse; 9 is the operating keyboard; 10 is a monitor; 11 is a controller; 12 is a floppy disk drive; and 13 is a LAN cable.

Imaging unit 1 is a color television camera. Illumination unit 2 is of a single piece with imaging unit 1 and is mounted on X-axis table 3.

X-axis table 3 has a motor (not pictured) and a moving frame (not pictured) inside a fixed rectangular frame. Imaging unit 1 and illumination unit 2, which are formed as a single piece, are mounted on the moving frame. When the aforesaid motor is driven forward and in reverse, imaging unit 1 and illumination unit 2 are moved forward and backward along with the moving frame in a straight line in direction X.

Stage 5 consists of two parallel supports, 5a and 5b, which hold substrate 14 as shown in the drawing. These supports are mounted to Y-axis table 4.

Y-axis table 4 is orthogonal to X-axis table 3. It has a fixed rectangular frame which contains a motor and a moving frame (not pictured). Stage 5 is mounted to this moving frame. When the aforesaid motor is driven forward or in reverse, stage 5 moves back and forth with the moving frame in a straight line in direction Y.

Figure 2:
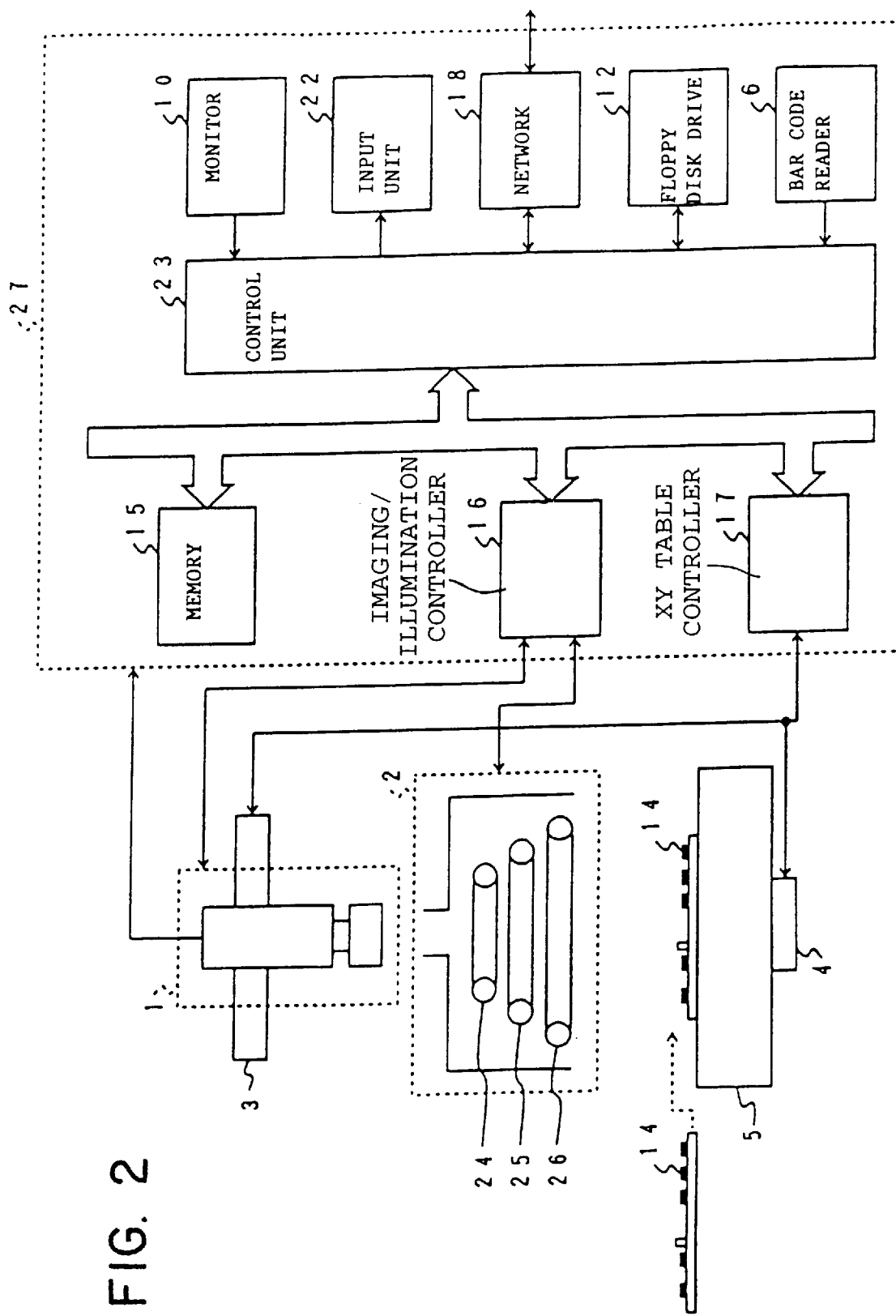
FIG. 2 is a diagram of the overall configuration of the repair device which is the first ideal embodiment of this invention.

FIG. 2 shows the overall configuration of the first ideal embodiment of this invention. As can be seen from the drawing, this device comprises imaging unit 1, illumination unit 2, X-axis table 3, Y-axis table 4, stage 5 and control processing unit 27.

Illumination unit 2 consists of a trichromatic light source composed of three annular light sources, 24, 25 and 26, each of which emits one of a red, green or blue light.

Figure 3:
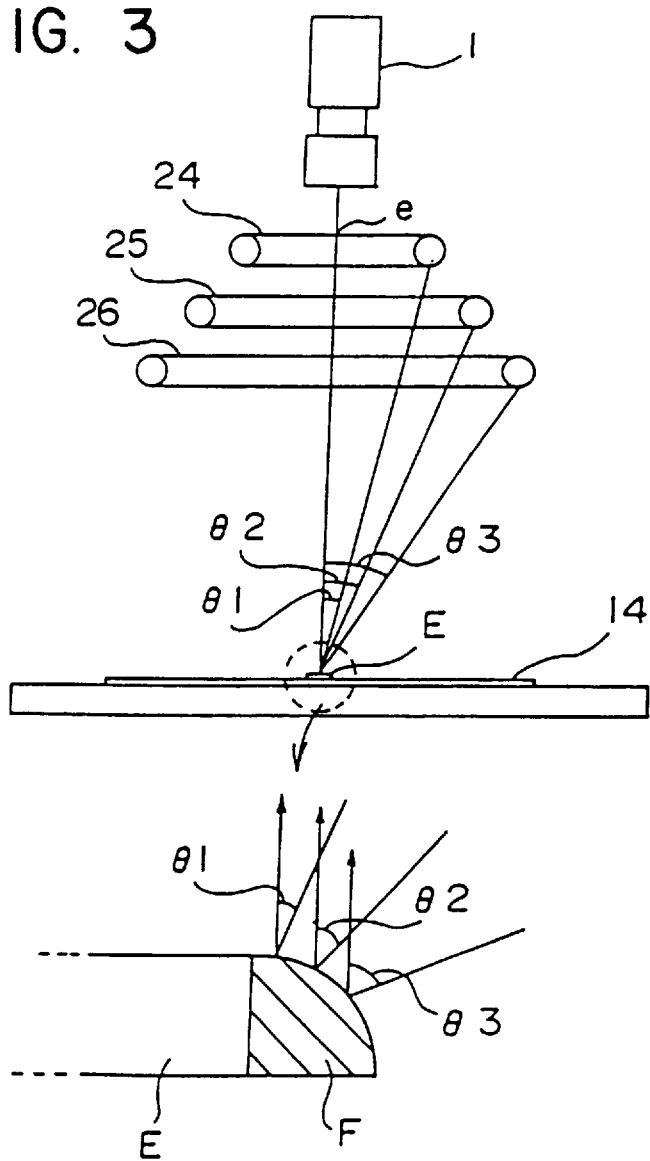
FIG. 3 illustrates the configuration and the operating principle of a trichromatic light source in an illumination unit.

FIG. 3 illustrates the configuration and the operating principle of the trichromatic light source in illumination unit 2. In FIG. 3, the aforesaid annular light sources 24, 25 and 26 are placed concentrically so that the central axis e of imaging passes through their center point. When the radius of the annular light source and its height are varied, the angle of incidence of the beam with respect to imaging axis e will vary, and three angles will result, which we shall call $\theta_1$, $\theta_2$ and $\theta_3$.

Illumination unit 2, which is configured as described above, illuminates solder F on component E, which is mounted on substrate 14. If we assume that solder F is a reflective surface, the light which strikes the solder at incident angle $\theta_1$ will be reflected by a portion of the solder with a given angle of inclination. The angle of inclination $\lambda_1$ of the portion of the surface which reflects this light along path e, which is the imaging axis, will be different from the angle of inclination $\lambda_2$ of the portion of the surface which reflects a beam with an angle of incidence of $\theta_2$ in axial direction e. Likewise, the angle of inclination $\lambda_3$ of the portion of the surface which reflects a beam with an angle of incidence of $\theta_3$ in axial direction e will differ from both $\lambda_1$ and $\lambda_2$. Solder F normally has a curved surface. A beam which strikes at angle of incidence $\theta_1$ the portion of solder F which we may consider to have an approximate angle of inclination of $\lambda_1$ will be reflected in direction e, along the axis of imaging. A beam which strikes at angle of incidence $\theta_2$ the portion of solder F which we may consider to have an approximate angle of inclination of $\lambda_2$ will also be reflected in axial direction e.

Solder F is accordingly imaged by imaging unit 1 and its image is displayed on monitor 10. A portion of the solder will appear to be red; another portion with a different angle of inclination will appear to be green; another portion with yet a third angle of inclination will appear to be blue. From this tricolor image, the operator is able to determine the shape of solder F.

To give an example, let us assume that annular light source 24 emits red light, light source 25 emits green, and light source 26 emits blue light. In the colored image, the portion of solder F with the smallest angle of inclination will be red, the portion with the greatest angle of inclination will be blue, and the portion with an intermediate angle of inclination will be green.

To return to FIG. 2, control processing unit 27 consists of controller 16 for imaging and illumination; X and Y table controller 17; monitor 10; memory 15; floppy disk drive 12; input unit 22; bar code reader 6; network input and output unit 18; and control unit 23. Of these components, controller 16, X and Y table controller 17, memory 15, floppy disk drive 12, network input and output unit 18 and control unit 23 are housed within controller 11, which is shown in FIG. 1. Input unit 22 comprises keyboard 7, mouse 8 and operating keyboard 9.

Controller 16 controls the imaging operation performed by imaging unit 1 and the emission of light by light sources 24, 25 and 26 in illumination unit 2 according to commands from control unit 23. The image signals representing the component to be repaired which are outputted by imaging unit 1 are converted to color video signals and transmitted to control unit 23.

X and Y table controller 17 controls the operation of X-axis table 3 and Y-axis table 4 in response to commands from control unit 23.

Monitor 10 displays the colored image of the component to be repaired produced by imaging unit 1, a diagram of the layout of the substrate to be repaired and various necessary data, all of which it receives from control unit 23.

Memory 15 stores the program which operates this invention. It also stores the defect files transmitted by control unit 23, image files and various other data.

Keyboard 7, mouse 8 and operating keyboard 9 in input unit 22 may be used as needed by the operator to input various data. Operating keyboard 9 has keys for which there is a specific need (such as keys to enter the defect code) and is independent from keyboard 7. Bar code reader 6 reads the bar code on each substrate to be repaired to determine the ID number of that substrate. This ID number can then be entered via keyboard 7.

Floppy disk drive 12 reads defect and image files created by the inspection device off a floppy disk in response to a command from control unit 23. It also writes onto a floppy disk defect files created by control unit 23.

Network input and output unit 18 is connected to LAN cable 13. In response to a command from control unit 23, it takes from a network via LAN cable 13 defect and image files created by the inspection device. It also transmits to the network via LAN cable 13 defect files created by control unit 23.

Figure 4:
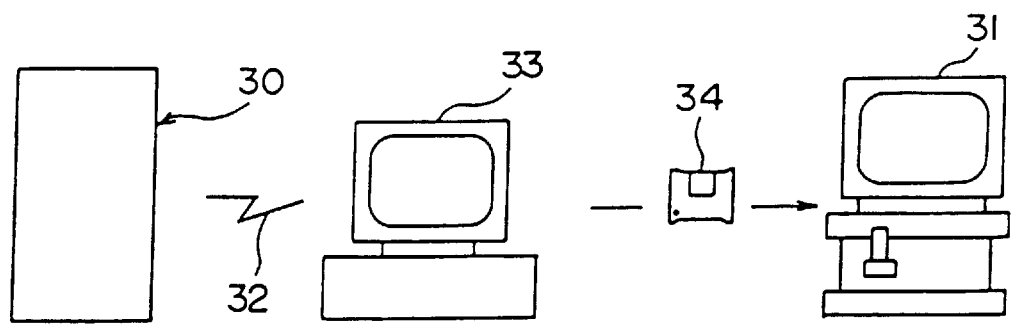
FIG. 4 illustrates the configuration of a system which includes this invention and an inspection device (when the inspection results are supplied by means of a floppy disk).
Figure 5:
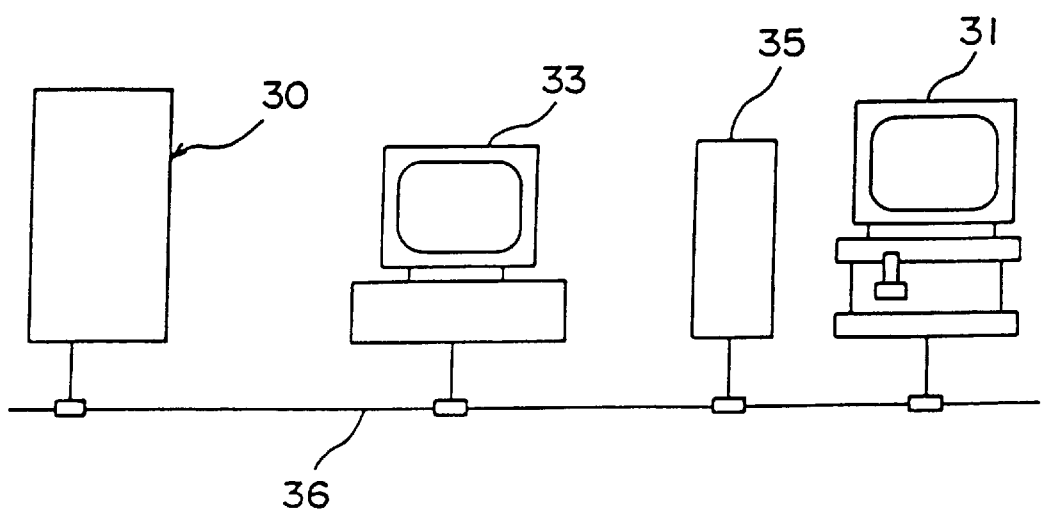
FIG. 5 illustrates the configuration of a system which includes this invention and an inspection device (when the inspection results are supplied by means of a LAN).

Depending on the way in which the system which includes the inspection device is configured, either the aforesaid floppy disk drive 12 or network input and output unit 18 may be used. FIGS. 4 and 5 illustrate two ways a system connected to an inspection device might be configured. FIG. 4 shows a system mediated by a floppy disk; FIG. 5 shows a system using a LAN.

In FIG. 4 the defect and image files created by inspection device 30 are transmitted to data acquisition terminal 33 by way of a transmission line such as an RS-232C. Data acquisition terminal 33 stores the defect and image files it acquires on floppy disk 34. The defect and image files are supplied to repair device 31 by way of floppy disk 34.

In FIG. 5 the defect and image files acquired via data acquisition terminal 33 through LAN cable 36 are transmitted to server 35, a hard disk or the like, by way of the same LAN cable 36 and stored there. Repair device 31 reads out of server 35 the necessary defect and image files.

Returning again to FIG. 2, control unit 23 contains a microprocessor. According to a program which it reads out of memory 15, it controls the overall operation of the various components of control processing unit 27, performs various operations and edits defect and image files.

Figure 6:
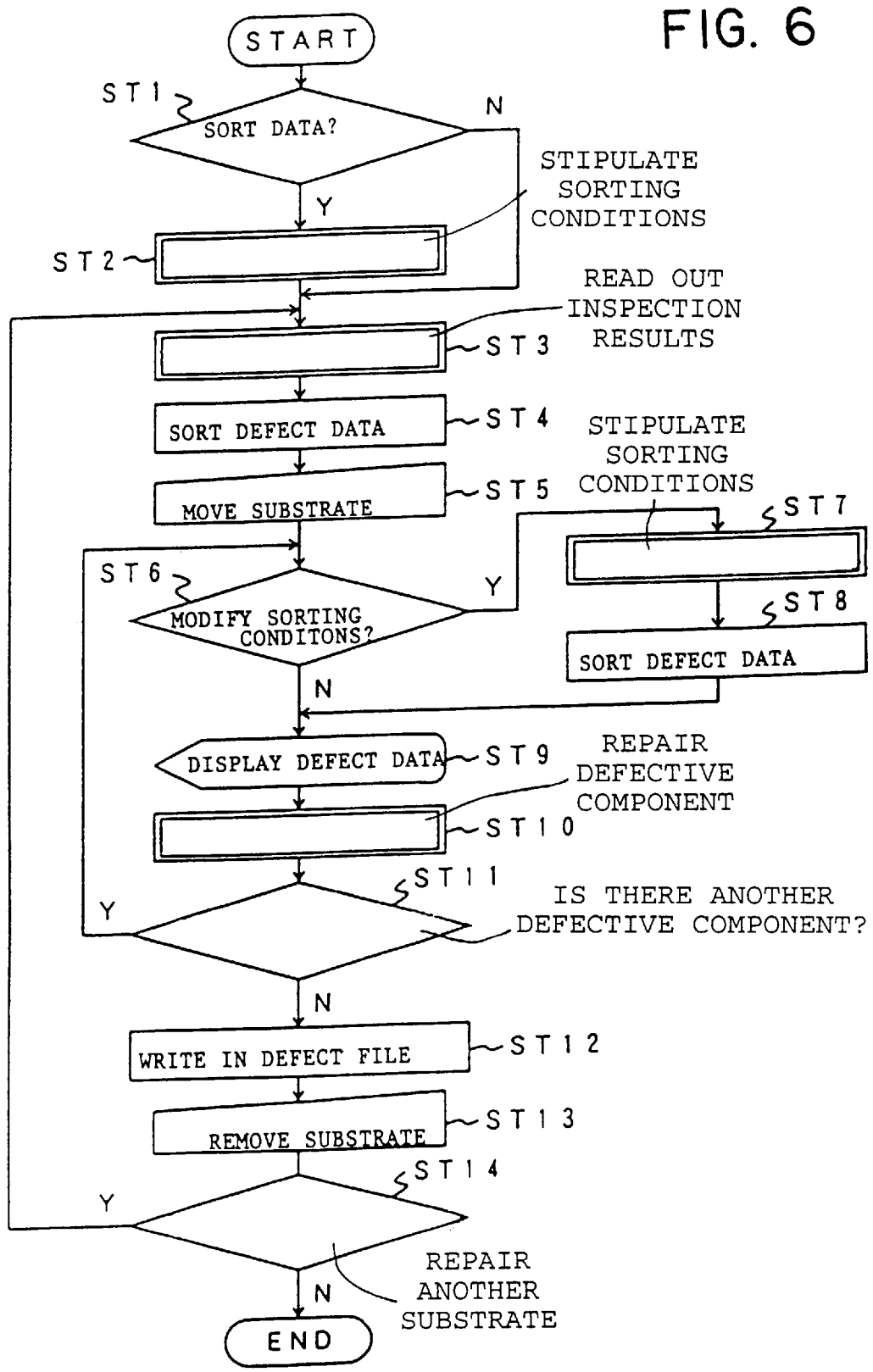
FIG. 6 is a flowchart of the order of processing executed by the repair device in the first ideal embodiment of this invention.
Figure 9:
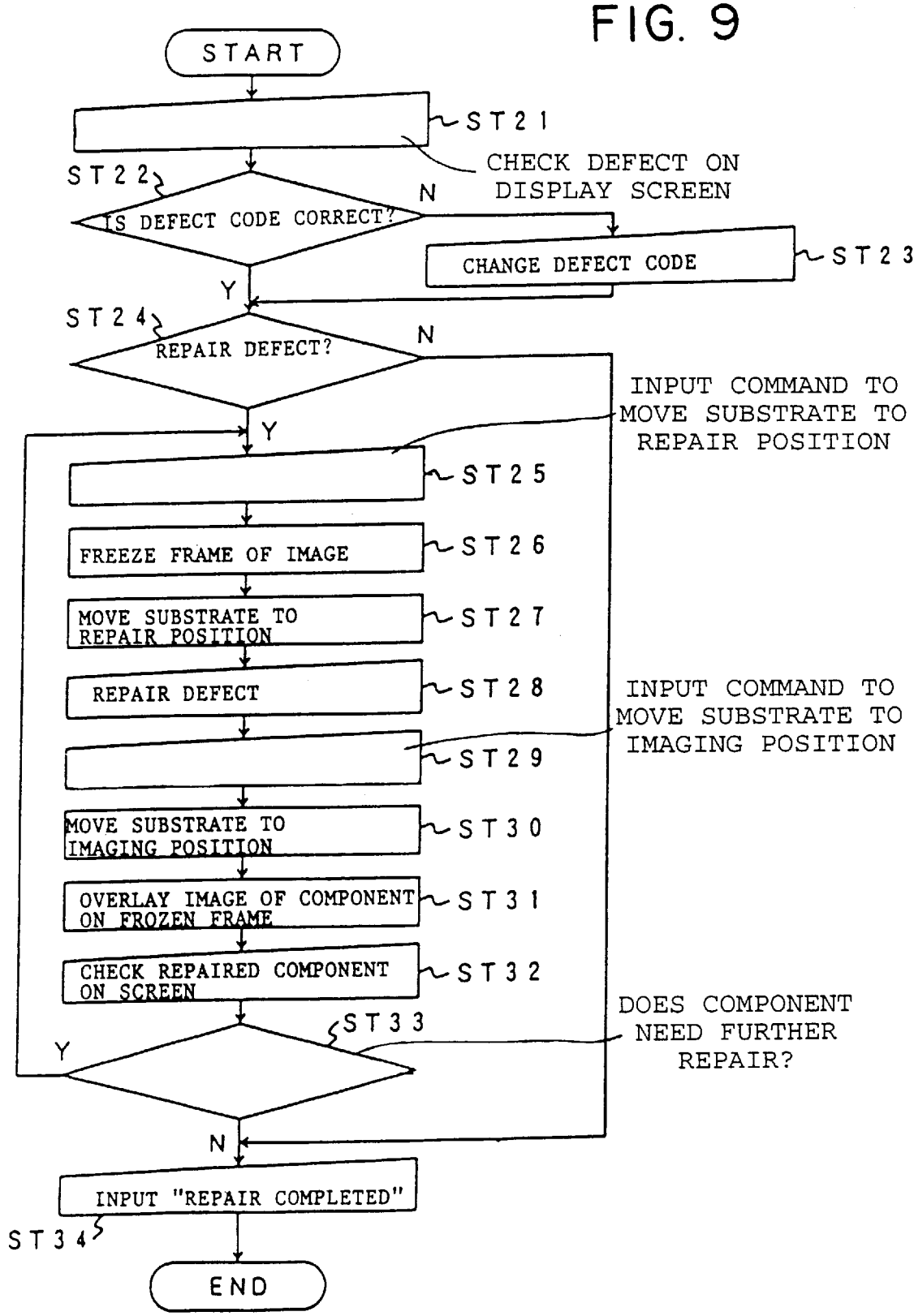
FIG. 9 is a subroutine of the flowchart shown in FIG. 6. It shows the order of processing involved in repairing the substrate.

FIG. 6 is a flowchart of the processing performed by the first ideal embodiment of this invention. FIG. 7 shows the subroutines in Steps 2 and 7 in FIG. 6. It is a flowchart of how the sorting conditions are set. FIG. 8 is the subroutine in Step 3 in FIG. 6. It is a flowchart showing the order of processing involved in reading out inspection results. FIG. 9 is the subroutine in Step 10 in FIG. 6. It is a flowchart giving the order of the repair operation.

Figure 10:
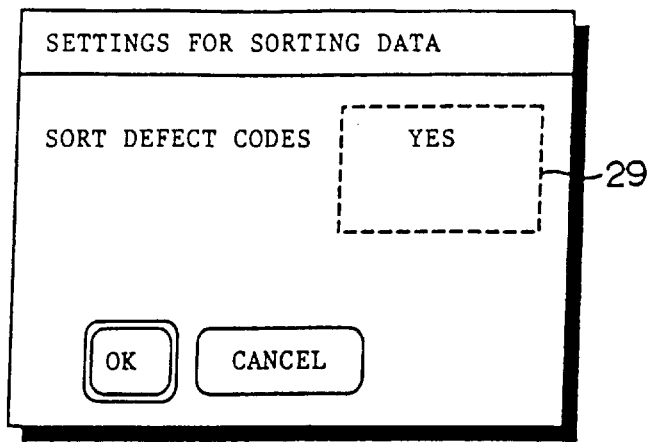
FIG. 10 is the screen displayed on the monitor to set "Sort Data."

In Step 1 of FIG. 6, the operator inputs whether to sort the data concerning defective components in the defect file according to their defect codes. The "set data sorting" screen shown in FIG. 10 is displayed on monitor 10. The operator clicks on input window 29 with mouse 8 shown in FIG. 1 to set whether to sort the data. If he clicks on "Sort Data" in input window 29, it will change to "Do Not Sort Data." When the setting has been completed, the operator must click on "OK."

If in Step 1 the operator has inputted "Do Not Sort Data," we proceed to Step 3. If he has inputted "Sort Data," we proceed to Step 2.

Figure 11:
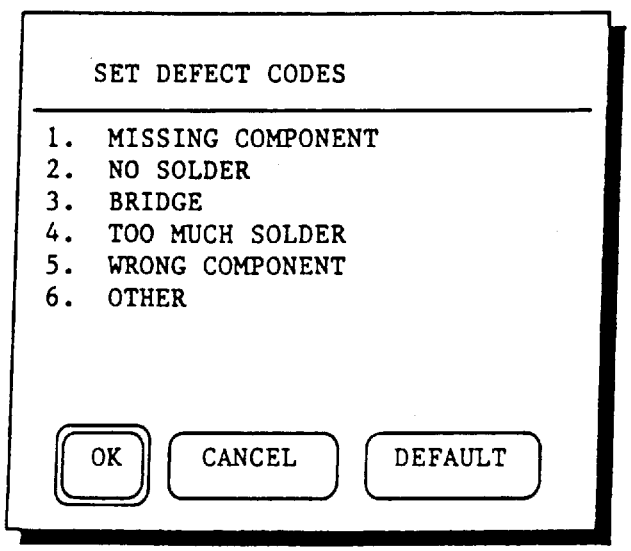
FIG. 11 is the screen displayed on the monitor to set defect codes.

In Step 2, the conditions for sorting the data are set. Because a wide variety of defect codes (hereafter, "inspection defect codes") is assigned by the inspection device, in Step 16 of FIG. 7 these inspection defect codes are sorted, and independent defect codes are set anew for the repair device. FIG. 11 shows the screen displayed on the monitor for setting defect codes.

Figure 12:
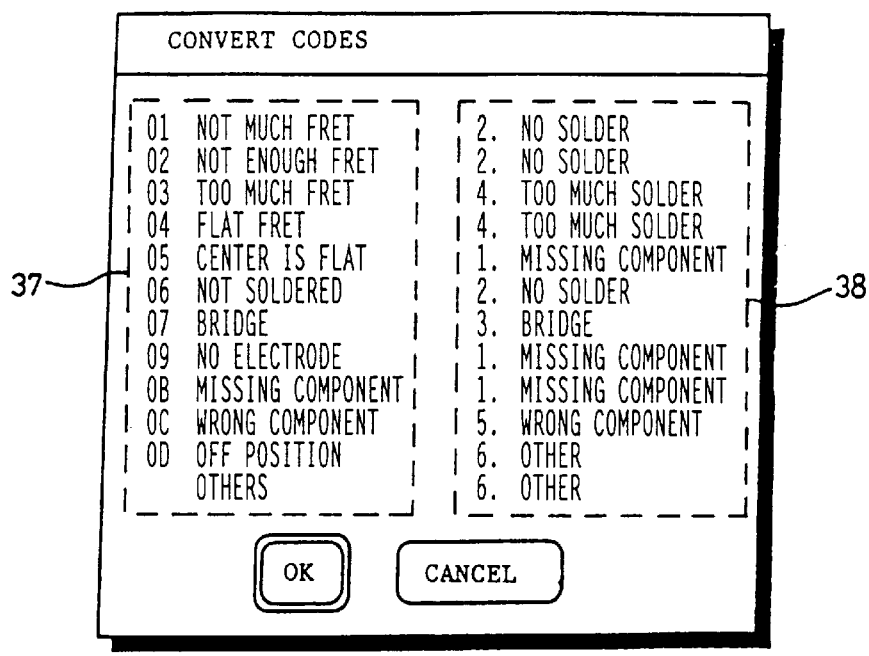
FIG. 12 is the screen displayed on the monitor to change the settings for defect codes.

In Step 17 of FIG. 7, the inspection defect codes are converted to the defect codes which were set in Step 16. FIG. 12 shows the screen displayed on the monitor to convert the defect codes. In this figure, 37 shows the inspection defect codes and 38 the defect codes used by the repair device. For example, the inspection defect code 01, "not much fret," is converted to the defect code 2, "no solder," for the repair device.

Figure 13:
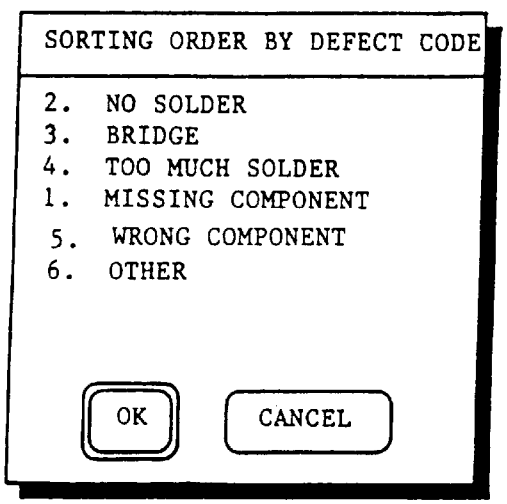
FIG. 13 is the screen displayed on the monitor to set the order in which defect codes are to be sorted.

In Step 18 of FIG. 7, the order in which the defect codes will be sorted is set. We then proceed to Step 3 in FIG. 6. FIG. 13 shows the screen which appears on the monitor to set the order in which defect codes will be sorted. For these defect data, data representing components with a defect code of 2, "no solder," are to be sorted first, followed by those with a code of 3, "bridge." Data for components having the same defect code will be sorted in increasing order by part number. In other words, they will be arranged in the same order in which they were inspected.

In Step 3 of FIG. 6, the defect and image files showing the results of the inspection are read out. In Step 19 of FIG. 8, the operator inputs the ID number of the substrate to be repaired using either bar code reader 6 or keyboard 7, as shown in FIG. 1. In Step 20, control unit 23 reads off the floppy disk or LAN server the defect and image files for the ID number which was input.

Returning to FIG. 6, in Step 4 control unit 23 sorts the data in the defect file according to the conditions stipulated in Step 2. We then proceed to Step 5. However, if "Do Not Sort Data" was input in Step 1 and sorting conditions were not stipulated in Step 2, the data will not be sorted.

In Step 5, the operator places the substrate to be repaired on stage 5.

In Step 6, if the sorting conditions are not to be modified, the operator inputs "No," and we proceed to Step 9. If the operator inputs "Yes" in this step to signify that he wishes to modify the sorting conditions, we proceed to the processing in Steps 7 and 8, which will be discussed shortly.

In Step 9, control unit 23 moves X-axis table 3 and Y-axis table 4 until the first defective component from the defect file which was sorted is in imaging position, directly below imaging unit 1. The defect data for the component, which consist of the color image of the component captured by imaging unit 1, its defect code and a diagram showing the layout of components on the substrate which was created from data in the image file, are all displayed on monitor 10.

Figure 14:
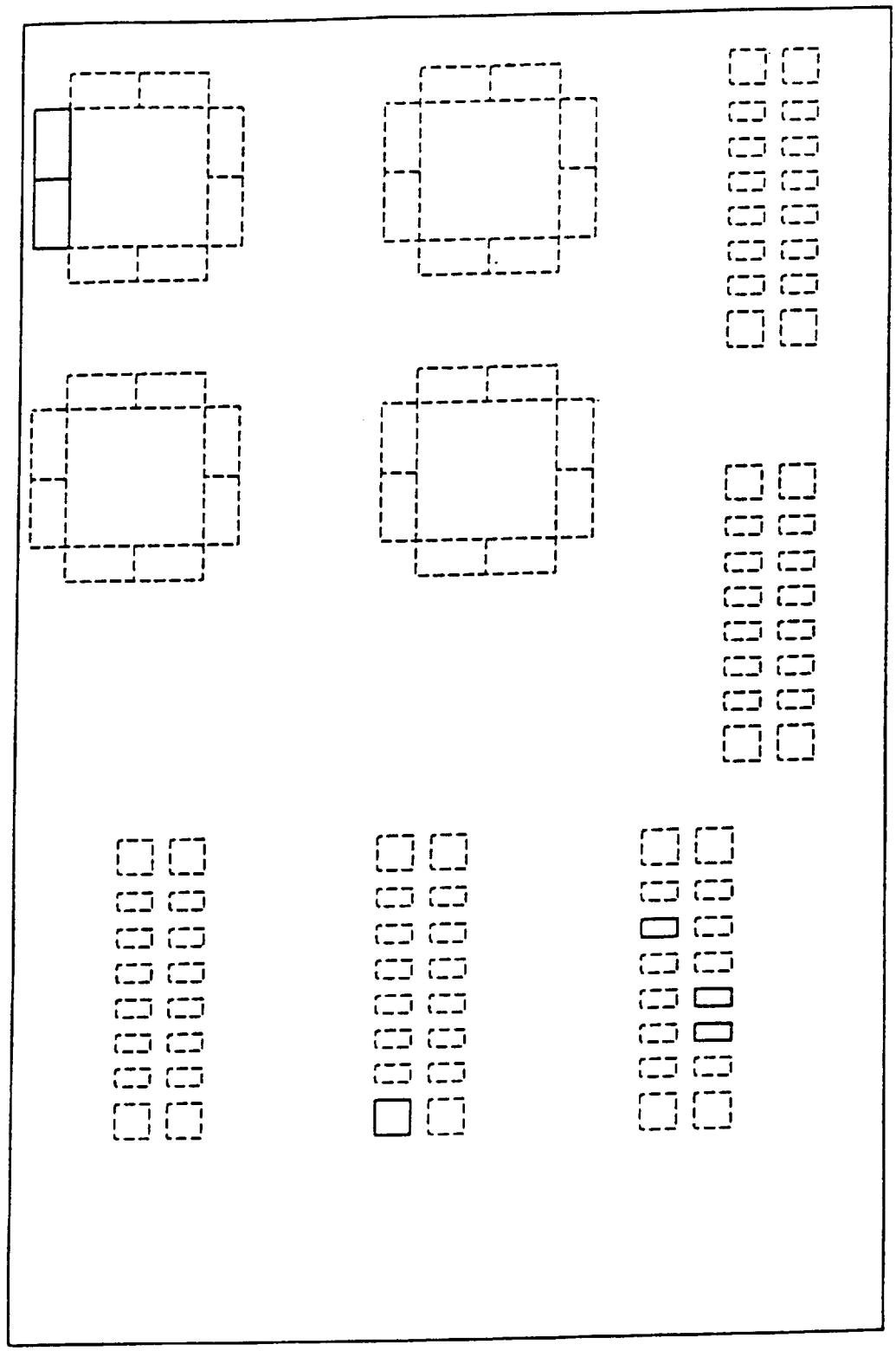
FIG. 14 is a layout diagram created from an image file.

FIG. 14 is a layout diagram created from data in the image file. In this figure, the regions indicated by broken or solid lines represent components mounted on the substrate. Components shown by solid lines are those which were judged to be defective by the inspection device. ICs are divided into several regions for the purpose of inspection. Each region may be shown with broken or solid lines.

Figure 15:
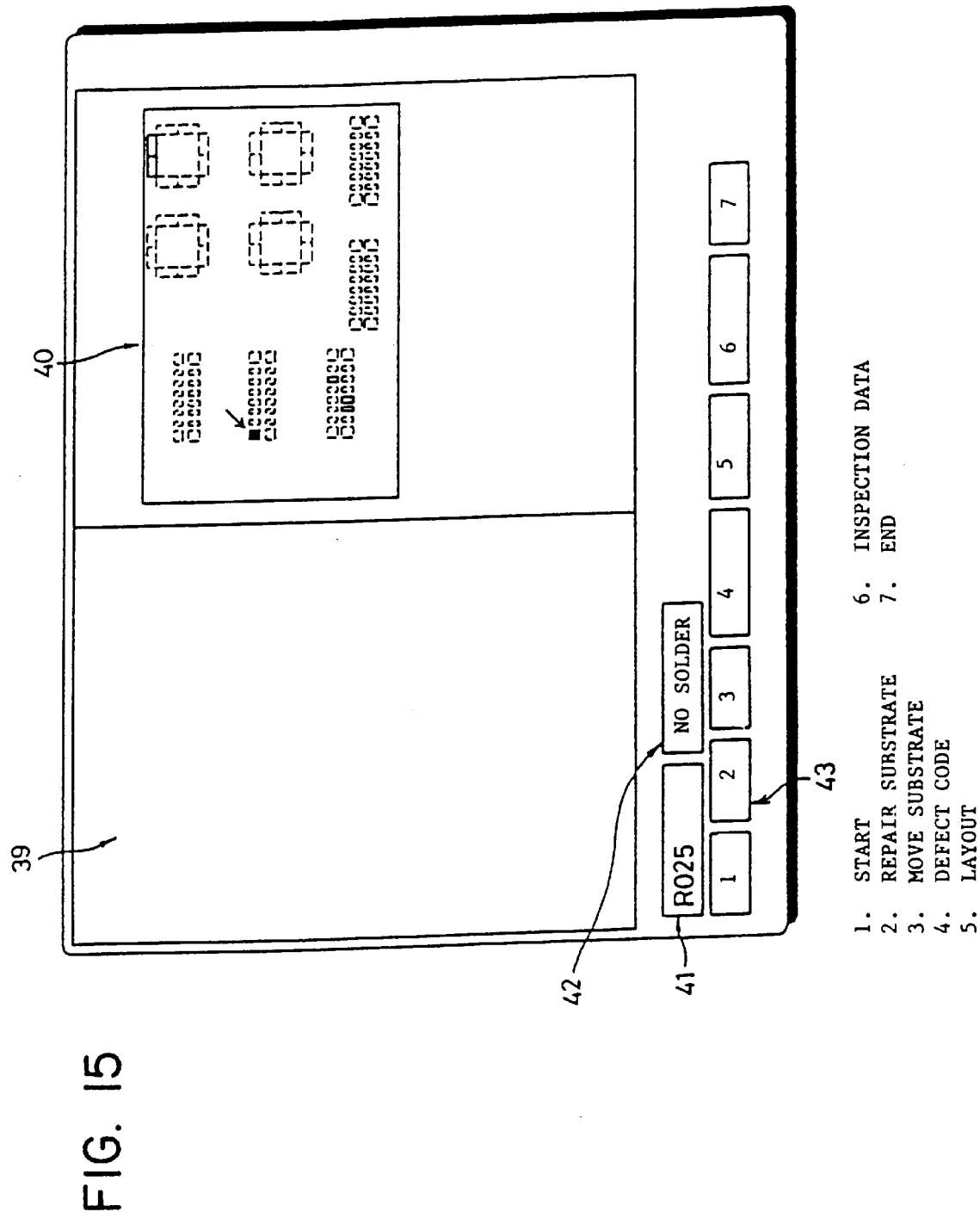
FIG. 15 is the screen displayed on the monitor to show the operator data concerning defective components.

FIG. 15 shows the defect data screen displayed on the monitor. In this figure, 39 is the camera frame in which the color image of the defective component captured by imaging unit 1 is displayed. 40 is a layout diagram displayed in a camera frame to indicate where on the substrate the defective components are. It uses the layout diagram shown in FIG. 14, and distinguishes the defective components in some way (for example, by coloring them or using arrows to point to them). 41 is the identification code for the defective component which is displayed on the camera frame. 42 is the description of the defect which corresponds to the defect code for this component. 43 is the command menu. In the repair operation in Step 10 of FIG. 6, items are selected from the command menu by clicking on them with mouse 8.

Returning to FIG. 6, in Step 10 the operator performs the repair while viewing the defect display screen. Specifically, in Step 21 of FIG. 9, the operator views the camera frame on monitor 10 to check the condition of the defect. In Step 22, if he determines that the defect code displayed on monitor 10 is the correct one, he proceeds to Step 24. If he determines that the code is wrong or that the location of the defect does not exist, he changes or cancels the defect code in Step 23 before proceeding to Step 24.

In Step 24, the operator inputs whether he will repair this component. If he will not, he proceeds to Step 34. If he will, he proceeds to Step 25.

In Step 25 the operator inputs the command to move the substrate to the repair site (the site where it is loaded and unloaded). In Step 26, control unit 23 freezes a camera frame on monitor 10. In Step 27, the substrate is moved to the repair site.

In Step 28, the operator consults the layout diagram displayed on monitor 10, finds the defective component and repairs it. In Step 29 he inputs the command to move the substrate to the imaging site. In Step 30, control unit 23 moves the substrate to the imaging site and images the component a second time. In Step 31 a color image of the component is overlaid on the camera frame.

In Step 32, the operator checks the portion he has just repaired on the camera frame. In Step 33, he inputs whether further repairs are required. If the response is "yes," he returns to Steps 25 through 32. If the response is "no," he proceeds to Step 34.

In Step 34, the operator inputs the fact that the repair of this component, that is, of the first defective component in the defect file, has been completed. He then proceeds to Step 11 in FIG. 6.

In Step 11, if there is another defective component, he returns to Step 6. If he wishes to modify the sorting conditions, meaning the defect code and the sorting order, he inputs "yes." In Step 7 he stipulates new sorting conditions. In Step 8 the defect data are sorted according to the new conditions, and he proceeds to Step 9. If he does not need to modify the sorting conditions, he immediately proceeds to Step 9. The processing in Step 7 is the same as that in Step 2, and that in Step 8 is the same as that in Step 4 except for the fact that when the data are sorted in Step 8, components which have already been repaired are eliminated.

In Steps 9 and 10, the next defective component is processed just as the first one was. This component will be the second defective component resulting from the sorting in Step 2 or the first defective component resulting from the sorting in Step 8.

The processing in Steps 6 through 10 is repeated. If in Step 11 all defective components have been repaired, in Step 12 control unit 23 writes onto the floppy disk or LAN server the edited defect and image files, which are kept separate from those created by the inspection device. These edited files include files whose defect data have been sorted, files which have been given defect codes or flagged by the repair device when their repairs were completed, defect files in which defect codes mistakenly assigned by the inspection device have been corrected, and image files which have been corrected along with these defect files.

FIG. 16 illustrates how the data are configured in defect files. FIG 16 (*a*) shows the configuration of the data in a defect file in the inspection device before they are sorted according to defect code. FIG. 16 (b) shows the configuration after the data have been sorted according to defect code. FIG. 16 (c) shows the configuration of the data in the defect file partway through the repair operation. In FIG. 16 (c), an asterisk in the "Repaired" column indicates that the repair has been completed, and a dash indicates that it has not.

In Step 13 of FIG. 6, the operator inputs the command to move the substrate to the loading and unloading site and it is moved to the site and removed from stage 5. In Step 14, the operator inputs whether he will repair another substrate. If he inputs "Yes," he returns to Step 3, and the new substrate is processed just as the previous one was.

With the ideal embodiment of this invention described above, defect data are sorted according to defect code. The operator is instructed to repair the defective components in the order into which they were sorted. This method allows all components which have the same type of defect to be repaired consecutively, so the operator does not need to repeatedly pick up a different repair tool. The repair operation can be performed more efficiently.

FIG. 17 is a sketch of a second ideal embodiment of this invention. With the exception of optical highlighter 28, all the components in the drawing are the same as those in the previous embodiment. They have been given the same numbers and will not be discussed further at this point.

The overall configuration of the second ideal embodiment of this invention is identical to that of the first embodiment, which is shown in FIG. 2, with the addition of optical highlighter 28. Imaging and illumination controller 16 is replaced by controller 47, memory 15 by memory 48, control unit 23 by control unit 49, and control processing unit 27 by control processing unit 50.

Imaging and illumination controller 47 controls the imaging operation performed by imaging unit 1, the emission of light by illumination unit 2, and the actuation and deactuation of optical highlighter 28. The signal representing the image of the component to be repaired which is outputted by imaging unit 1 is converted to a color video signal and transmitted to control unit 49.

Memory 48 stores the repair program needed to run this invention. It also stores the defect and image files sent from control unit 49 and a variety of other data.

Control unit 49 contains a microprocessor. According to the repair program which it reads out of memory 48, it controls the overall operation of the various components of control processing unit 50, creates defect data, performs various operations and edits defect and image files.

FIG. 18 is a plan view illustrating the operation of X-axis stage 3 and Y-axis stage 4 in the second ideal embodiment of this invention. It shows a substrate loaded on stage 5. FIG. 18 (a) shows the site where substrate 14 is loaded and where the defective portion of component E (marked with an x) will be repaired. FIG. 18 (b) shows the site where the defective portion will be imaged. FIG. 18 (c) shows the location where the defective portion will be highlighted by a spotlight. FIG. 19 is a lateral view of the second embodiment. FIG. 20 is a cross section of optical highlighter 28.

As is shown in FIG. 20, highlighter 28 has a light source 44, such as an LED, and a condenser 45, which condenses the beam emitted by the light source, causing a spotlight to be projected onto the surface of substrate 46. When the substrate is moved to the highlighting location shown in FIG. 18 (c), imaging and illumination controller 47 actuates the light source, and the defective portion is highlighted by a spotlight.

In the second ideal embodiment of this invention, optical highlighter 28 is mounted to the side of illumination unit 2, as shown in FIGS. 17 and 19. The spotlight is made to strike the substrate perpendicularly. The location in which highlighter 28 is mounted and the highlighted location shown in FIG. 18 (c) should be adjusted so that the operator can repair the defective portion while the defect is highlighted by the spotlight. That is, it is desirable that the spotlight be located so that the operator can easily repair the component.

FIG. 21 is a flowchart of the processing performed by the second ideal embodiment of this invention. FIG. 22 is the subroutine in Steps 37 and 42 of FIG. 21. It is a flowchart of the steps entailed in stipulating the conditions for sorting. FIG. 23 is the subroutine in Step 38 of FIG. 21. It is a flowchart of the processing involved in reading out the inspection result. FIG. 24 is the subroutine in Step 45 of FIG. 21. It is a flowchart of the processing involved in repairing the substrate. FIG. 25 is the subroutine in Step 59 of FIG. 24. It is a flowchart of the processing involved in repairing each defective component.

In Step 36 of FIG. 21, the operator inputs whether to sort the data in the defect file according to defect codes (See FIG. 10).

If in Step 36 the choice was made not to sort the data, we proceed to Step 38. If the choice was made to sort the data, we proceed to Step 37.

In Step 37, the operator stipulates the conditions which govern sorting the data. Because a wide variety of defect codes is assigned by the inspection device, in Step 50 of FIG. 22 these inspection defect codes are sorted, and independent defect codes are set for the repair device (See FIG. 11).

In Step 51, the operator adjusts the settings so that the defect codes assigned by the inspection device can be converted to the defect codes used by the repair device which were established in Step 16 (See FIG. 12).

In Step 52, the operator sets the order in which the defect codes are to be sorted (See FIG. 13), and we proceed to Step 38 in FIG. 21.

In Step 38 of FIG. 21, the result of the inspection performed by the inspection device is displayed and the defect and image files are read out. In Step 53 of FIG. 23, the operator inputs the ID number of the substrate to be repaired using either bar code reader 6 or keyboard 7. In Step 54, control unit 49 reads the defect and image files for the ID number which was input off the floppy disk or LAN server.

Returning to FIG. 21, in Step 39 control unit 49 sorts the data in the defect file according to the conditions stipulated in Step 37. We then proceed to Step 40. However, if "Do Not Sort Data" was inputted in Step 36 or sorting conditions were not stipulated in Step 37, the data will not be sorted.

In Step 40, the operator places the substrate to be repaired on stage 5.

In Step 41, if the sorting conditions are not to be modified, the operator inputs "No," and we proceed to Step 44.

If in Step 41 the operator wishes to modify the sorting conditions, i.e., to modify the settings for the defect codes or the sorting order, he inputs "Yes." In Step 42 he stipulates new sorting conditions. In Step 43 the defect data are sorted according to the new conditions, and we proceed to Step 44. The processing in Step 42 is the same as that in Step 37, and that in Step 43 is the same as that in Step 38. If from Step 46 we proceed to the processing in Step 43 by way of Steps 41 and 42, the components which have already been repaired will be eliminated from the data to be sorted.

In Step 44, control unit 49 moves X-axis table 3 and Y-axis table 4 until the first defective component from the defect file which was sorted is in imaging position, directly below imaging unit 1. The defect data for the component, consisting of the color image of the component captured by imaging unit 1, the defect code for this component and a diagram showing the layout of components on the substrate which was created from data in the image file, are all displayed on monitor 10 (See FIG. 15).

In Step 45 the operator performs the repair while viewing the defect display screen. Specifically, in the subroutine shown in FIG. 24, in Step 55 the operator views the camera frame on monitor 10 to check the condition of the defect. In Step 56, if he determines that the defect code displayed on monitor 10 is the correct one, we proceed to Step 58. If he determines that the code is wrong or that the location of the defect does not exist, he changes or cancels the defect code in Step 57 before proceeding to Step 58.

In Step 58, the operator inputs whether he will repair this component. If he will not, we proceed to Step 60. If he will, we proceed to Step 59.

In Step 59 the operator repairs the defective component. That is to say, in Step 62 of FIG. 25, control unit 49 freezes a camera frame on monitor 10.

In Step 63, control unit 49 controls X and Y table controller 17 so that the defective component to be repaired which is displayed in the camera frame is moved by X-axis table 3 and Y-axis table 4 to the highlighting location. In Step 64, the control unit directs imaging and illumination controller 47 to actuate optical highlighter 28, and the defective component is highlighted by a spotlight.

In Step 65, the operator checks the defective component which is highlighted. If he can repair it in that location, he repairs it. When the substrate is positioned for imaging, illumination unit 2 is quite close to the surface of the substrate, making it impossible to repair. When the substrate is positioned for highlighting, it is not obstructed by illumination unit 2, so it may be possible to repair it.

If in Step 65 the substrate was repaired in the highlighting position, in Step 66 the operator inputs a command to move it to imaging position. In Step 67, control unit 49 turns off optical highlighter 28, and we proceed to Step 71.

If in Step 65 the substrate was not repaired in the highlighting position, in Step 66 the operator inputs a command to move it to the repair position (the site where the substrate is loaded). In Step 68, control unit 49 turns off optical highlighter 28, and in Step 69 the substrate is moved to the repair position.

In Step 70, the operator repairs the defective component. In Step 70a, he inputs a command to move the substrate to the imaging position, and we proceed to Step 71.

In Step 71, control unit 49 moves the substrate to the imaging position and the component is imaged again. In Step 72, it overlays a color picture of the component on the camera frame, and we proceed to Step 60 in FIG. 24.

In Step 60, the operator checks the repaired component in the camera frame by eye and inputs whether further repairs are necessary. If he inputs "Yes," we return to Step 59; if he inputs "No," we proceed to Step 61.

In Step 61, the operator inputs the fact that the repair of this component, that is, of the first defective component in the defect file, has been completed. He then proceeds to Step 45 in FIG. 21.

In Step 14, if there is another defective component, he returns to Step 41. Just as with the first defective component, the defect is repaired via the processing executed in Steps 41 through 45. This processing is repeated for every defective component.

If in Step 46 all defective components have been repaired, in Step 47 control unit 49 writes onto the floppy disk or LAN server the edited defect and image files, which are kept separate from those created by the inspection device. These edited files include files whose defect data have been sorted, files which have been given defect codes or flagged by the repair device when their repairs were completed, defect files in which defect codes mistakenly assigned by the inspection device have been corrected, and image files which have been corrected along with these defect files.

In Step 48, the operator inputs a command to move the substrate to the loading position and removes it from stage 5. In Step 49, he inputs whether he will repair the next substrate. If he inputs "Yes," we return to Step 38 and execute the same processing as with the previous substrate.

With the second ideal embodiment of this invention, which is described above, the data concerning defective components are sorted according to their defect codes. The operator is given directives to repair the defective components in the order resulting from the sorting. Because all components with the same type of defect are pointed out consecutively, the operator does not need to repeatedly pick up a different repair tool. The portions of the substrate which are to be repaired are highlighted with a spotlight by highlighter 28, so the operator does not need to search the substrate for the defective component. This improves the efficiency of the repair operation.

We shall next discuss a third ideal embodiment of this invention. The appearance of this third embodiment is identical to that of the first embodiment which was pictured in FIG. 1, so we shall not discuss it further here.

FIG. 26 shows the overall configuration of the third ideal embodiment of this invention. As can be seen in the drawing, this invention consists of imaging unit 1, illumination unit 2, X-axis table 3, Y-axis table 4, stage 5 and control processing unit 53.

Illumination unit 2 consists of a trichromatic light source composed of three annular light sources, 24, 25 and 26, each of which emits one of a red, green or blue light.

Control processing unit 53 consists of controller 16 for imaging and illumination; X and Y table controller 17; monitor 10; memory 52; floppy disk drive 12; input unit 22; bar code reader 6; network input and output unit 18; and control unit 51.

Controller 16 controls the imaging operation performed by imaging unit 1 and the emission of light by light sources 24, 25 and 26 in illumination unit 2 according to commands from control unit 51. The image signals representing the component to be repaired which are output by imaging unit 1 are converted to color video signals and transmitted to control unit 51.

X and Y table controller 17 controls the operation of X-axis table 3 and Y-axis table 4 in response to commands from control unit 51.

Monitor 10 displays the color image of the component to be repaired produced by imaging unit 1, a diagram of the layout of the substrate to be repaired and various necessary data, all of which it receives from control unit 51.

Memory 52 stores the program which operates this invention. It also stores a variety of data, including the defect files transmitted by control unit 51.

Input unit 22 has a keyboard 7, a mouse 8 and an operating keyboard 9, as shown in FIG. 1. The operator can use these as needed to input various data.

Floppy disk drive 12 reads defect and image files created by the inspection device off a floppy disk in response to a command from control unit 51. It also writes onto a floppy disk defect files created by control unit 51.

Network input and output unit 18 is connected to the LAN cable 13 shown in FIG. 1. In response to a command from control unit 51, it acquires from a network via LAN cable 13 defect and image files created by the inspection device. It also transmits to the network via LAN cable 13 defect files created by control unit 51.

Depending on the way in which the system which includes the inspection device is configured, either the aforesaid floppy disk drive 12 or network input and output unit 18 may be used.

Control unit 51 contains a microprocessor. According to a program which it reads out of memory 52, it controls the overall operation of the various components of control processing unit 53, creates defect data, performs various operations and reads out and edits defect files.

FIG. 27 is a flowchart of the processing performed by the third ideal embodiment of this invention. FIG. 28 shows the subroutines in Steps 81 and 86 in FIG. 27. It is a flowchart of how the sorting conditions are set. FIG. 29 is the subroutine in Step 82 in FIG. 27. It is a flowchart showing the order of processing involved in reading out inspection results. FIG. 30 is the subroutine in Step 89 in FIG. 27. It is a flowchart giving the order of the repair operation.

In Step 81 of FIG. 27, the various conditions are stipulated. More specifically, in Step 100 of the subroutine shown in FIG. 28, for each defect code assigned by the inspection device (hereafter referred to as "inspection defect codes"), the type of repair to be done and the tool needed are recorded. FIG. 31 shows the screen used to record the type of repair and the tool. In FIG. 31, the first screen to appear is 55, the "Select Component" screen. The operator moves arrow 56 by means of keyboard 7 shown in FIG. 1. He then clicks on "OK" with mouse 8 to select the component class. If he selects "R1608" as the component class, the next screen to appear will be 57, the "Designate Repair and Tool" screen. The operator records the type of repair and tool according to the inspection defect code. If "- - -" appears in the repair and tool column of screen 57, a type of repair and a tool have not been designated for that inspection code.

Returning to FIG. 27, because a wide variety of defect codes is assigned by the inspection device, in Step 101 these codes are sorted and separate defect codes are assigned for the repair device (see FIG. 11). For every inspection defect code, a newly assigned defect code is recorded (See FIG. 12).

In Step 102, the method to be used to sort the data in the defect file is stipulated. That is, the operator inputs whether to sort the data by defect code or by type of repair. The screen shown in FIG. 32 is displayed on monitor 10, which is shown in FIG. 1. The operator sets the sorting method by clicking on input window 58 with mouse 8 shown in FIG. 1. In FIG. 32, if he clicks on "Yes" in input window 29, it will change to "No." The sorting conditions, i.e., whether to sort the data by defect code or by type of repair, are also interlocked. If the operator clicks on "Yes" for "Sort Data by Type of Repair," it will change to "No," and "Sort Data by Defect Code" will change to "Yes." When he has completed setting the conditions, the operator clicks on "OK."

If sorting by type of repair was chosen in Step 102, the order in which the types of repairs are to be sorted is recorded in Step 103. Returning to FIG. 27, we proceed to Step 82. FIG. 33 shows the screen used to set the order in which the data are to be sorted by type of repair. In this figure, the defect data for components which need the repair "apply solder" are sorted first, and those for components which need the repair "cut bridge" are sorted next. Defect data for components requiring the same repair will be sorted in increasing order by part number. In other words, they will be arranged in the same order in which they were inspected.

If sorting by defect code was chosen in Step 102, in Step 104, the order in which the defect codes will be sorted is recorded (See FIG. 13). We return to FIG. 27 and proceed to Step 82.

In Step 82, the defect and image files showing the results of the inspection are read out. That is, in Step 105 of the subroutine shown in FIG. 29, the operator inputs the ID number of the substrate to be repaired using either bar code reader 6 or keyboard 7, both of which are pictured in FIG. 1. In Step 106, control unit 51 reads off the floppy disk or LAN server the defect and image files for the ID number which was input. We return to FIG. 27 and proceed to Step 83.

In Step 83, control unit 51 sorts the data in the defect file according to the conditions stipulated in Step 81. In Step 84, the operator places the substrate to be repaired on stage 5, shown in FIG. 1.

In Step 85, if the sorting conditions stipulated in Step 81 are not to be modified, the operator inputs "No," and we proceed to Step 88. If the operator wishes to modify the conditions, he inputs "Yes," and he stipulates new conditions in Step 86. In Step 87, the defect data are resorted according to the new conditions, and we proceed to Step 88. The processing in Step 86 is the same as that in Step 81, and that in Step 87 is the same as that in Step 83. If from Step 90, which will be discussed hereafter, we proceed to the processing in Step 87 by way of Steps 85 and 86, the components which have already been repaired will be eliminated from the data to be sorted.

In Step 88, control unit 51 moves X-axis table 3 and Y-axis table 4 until the first defective component from the defect file which was sorted is in the imaging position shown in FIG. 18 (b), directly below imaging unit 1. The defect data for this component, which consist of the color image of the defective component captured by imaging unit 1, the defect code for this component and a diagram showing the layout of components on the substrate which was created from data in the image file (See FIG. 14), are all displayed on monitor 10.

FIG. 34 is the screen displaying the defect data in Step 88 of FIG. 27. In the same figure, 39 is the camera frame displaying the color video image of the defective component which was captured by imaging unit 1. 40 is a layout screen which uses the layout diagram to indicate where the component displayed in the camera frame is located on the substrate. The component displayed in the camera frame is distinguished from the other defective components (by being colored or by an arrow, for example). 41 is the identification code for the defective component displayed in the camera frame, and 42 is a description of the defect which corresponds to the defect code for that component. 59 is the repair which this component needs. 60 is the tool needed to repair this component. 43 is the command menu, which can be started as needed to perform the repair in Step 89 of FIG. 27.

Returning to FIG. 27, in Step 89, the operator repairs the defect while viewing the screen displaying the defect data. That is, in Step 110 of the subroutine shown in FIG. 29, the operator views the camera frame on monitor 10 to check the condition of the defect. In Step 111, if he determines that the defect data displayed on monitor 10 are correct, we proceed to Step 112. If he determines that the data are wrong or that the location of the defect does not exist, in Step 113 he changes or cancels the inspection defect code, the description of the repair needed, or the tool to be used, and we proceed to Step 113.

In Step 113, the operator inputs whether he will repair this component. If he will not, we proceed to Step 123. If he will, we proceed to Step 114.

In Step 114 the operator inputs an order to move the substrate to the repair position (the loading and unloading position) shown in FIG. 18 (*a*). In Step 115, control unit 51 freezes a camera frame on monitor 10. In Step 116, the substrate is moved to the repair position.

In Step 117 the operator consults the layout diagram shown on monitor 10, finds the defective component and repairs it. In Step 118 he inputs a command to move the substrate to the position shown in FIG. 18. In Step 119 control unit 51 moves the substrate to the imaging position and images the component again. In Step 120 a color image of the component is overlaid on the camera frame.

In Step 121, the operator checks the repaired component in the camera frame by eye, and in Step 122, he inputs whether further repairs are necessary. If he inputs "Yes," we repeat steps 114 through 121; if he inputs "No," we proceed to Step 123.

In Step 123, the operator inputs the fact that the repair of this component, that is, of the first defective component in the defect file, has been completed. We then proceed to Step 90 in FIG. 27.

In Step 90, if there is another defective component, we return to Step 85. Just as with the first defective component, we repeat the processing in Steps 85 through 89. If in Step 90 all defective components have been repaired, in Step 91 control unit 51 writes onto the floppy disk or LAN server the edited defect and image files, which are separate from those in the inspection device. These edited files include files whose defect data have been sorted, files which have been given defect codes and descriptions of repairs and tools needed by the repair device or flagged when their repairs were completed, defect files in which defect codes mistakenly assigned by the inspection device have been corrected, and image files which have been corrected along with these defect files.

In Step 92, the operator inputs a command to move the substrate to the loading position and removes it from stage 5. In Step 93, he inputs whether he will repair the next substrate. If he inputs "Yes," we return to Step 82 and execute the same processing as with the previous substrate.

With the third embodiment described above, then, the defect data are sorted according to type of repair needed. The operator is given directives to repair the defective components in the order resulting from the sorting. Because all components requiring the same type of repair are pointed out consecutively, the operator does not need to repeatedly pick up a different repair tool. Because the type of repair and the tool needed are indicated to the operator when he is about to make the repair, even an operator who lacks repair experience will never use the wrong tool or hesitate in choosing a tool. This improves the efficiency of the repair operation.

We shall next discuss a fourth ideal embodiment of this invention. Because the appearance of this embodiment is identical to that of the first embodiment, which was shown in FIG. 1, we shall not discuss it further at this point.

A drawing of the overall configuration of this fourth embodiment would be identical to that of the first embodiment shown in FIG. 2, with the following exceptions. Control unit 23 would be replaced by control unit 71; memory 15 would be replaced by memory 72; and control processing unit 27 would be replaced by control processing unit 73. In other words, the configuration of this embodiment is identical to that of the first embodiment with the exception of the control unit and the memory.

Memory 72 stores the program which runs this invention. It also stores various data such as the defect files for a number of substrates which are transmitted by control unit 71.

Control unit 71 contains a microprocessor. According to the program which it reads out of memory 72, it controls the overall operation of the various components of control processing unit 73, creates data concerning required repair time, performs various calculations and reads out and edits the defect files for a number of substrates.

FIG. 35 is a flowchart of the processing performed by the fourth ideal embodiment of this invention to produce repair times. FIG. 36 shows the subroutine in Step 134 of FIG. 35. It is a flowchart of the readout of one batch of inspection results. FIG. 37 is the subroutine in Step 140 in FIG. 35. It is a flowchart of the repair operation.

In Step 131 of FIG. 35 the inspection defect codes are sorted, and independent defect codes are set for the repair device (See FIG. 11). For each defect code assigned by the inspection device, the new defect code which has been assigned is recorded (See FIG. 12).

In Step 132, a repair time is recorded for every defect code assigned in Step 131. The repair time for a defect code is the time required to repair the defective component to which that code is assigned.

In Step 133, a limit is set for the total time which would be required to repair every defective component on a single substrate. This limit value is determined in consideration of economy of cost. It might be determined, for example, by finding the value for total repair time where it stops being cost-effective to repair a substrate.

FIG. 38 shows the screen used to set the repair time for each defect code in Step 132 and the limit for total repair time in Step 133.

Returning to FIG. 35, in Step 134 the defect and image files created during the inspection are read out for every substrate to be repaired. In Step 151 of the subroutine shown in FIG. 36, the operator inputs the ID numbers of all the substrates to be repaired using either the bar code reader 6 or the keyboard 7 pictured in FIG. 1. In Step 152, control unit 71 reads off the floppy disk or LAN server the entire set of defect and image files for all the ID numbers which have been input and stores them in memory 72.

Returning to FIG. 35, in Step 135 control unit 71 calculates the total repair time for each substrate.

In Step 136, the substrates are sorted in increasing or decreasing order of repair times. In Step 137, substrates whose repair time exceeds the limit are extracted.

In Step 138, the total repair time data are displayed on monitor 10. Either the identification codes for the substrates or their ID numbers are displayed, along with the total repair time, in the order into which they were sorted. Substrates whose total repair time exceeds the limit are marked with a special symbol. FIG. 39 is the screen which displays the total repair time data. In this figure the substrates have been sorted in increasing order of repair time. Triangles 75 are the symbols used to mark substrates whose projected repairs exceed the time limit. Column 76 indicates whether the repair has been completed. An asterisk indicates that the substrate has already been repaired when Step 138 has been reached by branching from Step 141, which will be discussed at a later point. A dash indicates that the substrate has not yet been repaired.

In Step 139, the operator views the screen displaying the aforesaid repair time data and selects the substrate he will repair next.

In Step 140, the operator repairs the substrate he has selected. That is, in Step 153 of FIG. 37, the operator enters the ID number of the substrate he has selected.

In Step 154, control unit 71 checks whether the repair time for this substrate is within the limit value. If due to operator error or some other cause this substrate exceeds the limit, in Step 155 an error message will be displayed and the substrate will not be repaired.

If in Step 154 the total repair time is found to be within the limit value, in Step 155 the operator places the substrate which he has selected on stage 5, shown in FIG. 1.

In Step 156, the operator stipulates the conditions under which the data in the defect file are to be sorted. Since the order of sorting must be recorded before the operator can repair the first substrate, he must input "Yes" at this time. In Step 157 the defect codes are recorded just as in Step 131 (See FIG. 12). In Step 158 the order in which the data have been sorted by defect code is recorded (See FIG. 13). In Step 159, control unit 71 sorts the data in the defect file according to the conditions stipulated in Steps 157 and 158, and we proceed to Step 160. If the defect codes set in Step 131 do not need to be modified, there is no need to record new defect codes in Step 157.

When several substrates have been repaired or when there is no need to modify the sorting conditions after branching from Step 162, which will be discussed later, the operator inputs "No" in Step 156, and we proceed to Step 160.

In Step 160, control unit 71 displays the data for the defective component on monitor 10 (See FIG. 15).

In Step 161, the component is repaired using the same order of processing as in the first embodiment, shown in FIG. 9.

In Step 162, if there is another defective component, we return to Step 156. Just as with the first defective component, we repeat the processing in Steps 157 through 161. If in Step 162 all defective components have been repaired, in Step 163 control unit 71 writes onto the floppy disk or LAN server the edited defect and image files, keeping them separate from those created by the inspection device. These edited files include files whose defect data have been sorted, files which have been given defect codes by the repair device or flagged when their repairs were completed, defect files in which defect codes mistakenly assigned by the inspection device have been corrected (see FIG. 16 (*c*)), and image files which have been corrected along with these defect files.

In Step 164, the operator inputs a command to move the substrate to the loading position and removes it from stage 5. We proceed to Step 141 in FIG. 35.

In Step 141, he inputs whether he will repair another substrate. If he inputs "Yes," we return to Step 138, and the operator views the total repair time data displayed on monitor 10. He selects a substrate from the group of substrates whose repair times are within the limit and which have not yet been repaired. In Step 140 he repairs this substrate.

Here the defect data have been sorted by defect code. It would be equally acceptable to sort the data by type of repair as in the third embodiment.

The repair processing in Step 161 of FIG. 37 could also be performed using an optical highlighter as in the second embodiment.

With the fourth ideal embodiment described above, then, the defect files for a number of substrates are read out in a batch. A repair time is stipulated for each defect code and the total repair time is calculated for each substrate. The total repair times are displayed along with the identification codes for the substrates in increasing or decreasing order. Substrates whose total repair times exceed a previously stipulated limit are flagged and removed from the batch to be repaired. This method allows the repair of substrates to be accomplished more cost-effectively.

As can be seen from the ideal embodiments described above, with the method and device to support in the repair of substrates according to this invention, the data concerning defective components are sorted according to defect code or type of repair needed. The operator is given directives to repair the defective components in the order into which the data have been sorted. Because the same types of defects are indicated consecutively, the operator does not need to repeatedly pick up a different repair tool. Thus, the repair operation is executed more efficiently.

In addition, the portion of the substrate which must be repaired is highlighted with a spotlight. The operator does not need to search the substrate for the defective component. This improves the efficiency of the repair operation.

Further, the type of repair and the tool needed to repair the defect are indicated to the operator, so even an operator who lacks repair experience will never use the wrong tool or hesitate in choosing a tool. This improves the efficiency of the repair operation.

In addition, the defect data for a number of substrates are read out in a batch. A repair time is stipulated for each defect code and the total repair time is calculated for each substrate. Codes identifying the substrates are displayed in the order of their total repair times. Substrates whose total repair times exceed a previously stipulated limit are flagged and removed from the batch to be repaired. This makes the repair of substrates more cost-effective.

What is claimed is:

1. A method for supporting the repair of defective portions of a substrate on which components are mounted when the defective portions have been discovered during an inspection process, said method comprising:

recording defective data associated with the defective portions discovered in the inspection process;

sorting the defective data by grouping together the defective data associated with a same type of defect; and indicating a defective location on the substrate where the defective portions were found in an order determined by the defective data associated with the same type of defect in said sorting.

2. A method according to claim 1, wherein said indicating comprises highlighting the defective location on the substrate in an order determined by the defective data associated with defects requiring a same type of repair.

3. A method according to claim 2, wherein said indicating further comprises indicating the type of repair required and tools to be used in the repair.

4. A method according to claim 1, wherein said indicating comprises highlighting the defective location by projecting a spotlight.

5. A method according to claim 1, further comprising imaging and displaying the defective location, after said sorting has completed, by moving the substrate so that the defective location is in a position where it can be highlighted.

6. A method for supporting the repair of defective portions of a substrate on which components are mounted when the defective portions have been discovered during an inspection process, said method comprising:

recording defective data associated with the defective portions discovered in the inspection process;

calculating a total repair time for the defective portions, and issuing a warning if the total repair time exceeds a predetermined time limit.

7. A method for supporting the repair of defective portions of a substrate on which components are mounted when the defective portions have been discovered during an inspection process, said method comprising:

recording defective data associated with the defective portions discovered in the inspection process; and sorting the defective data in an order corresponding to a total repair time of the substrate beginning with a shortest repair time required.

8. A device for supporting the repair of defective portions of a substrate on which components are mounted when the defective portions have been discovered during an inspection process, said device comprising:

a recorder configured to record defective data associated with the defective portions discovered in the inspection process;

a data sorter arranged to sort the defective data by grouping together the defective data associated with a same type of defect; and a data indicator arranged to highlight a defective location on the substrate where the defective portions are found in an order determined by the defective data associated with the same type of defect in said data sorter.

9. A device according to claim 8, wherein said data indicator highlights the defective location on the substrate in an order determined by the defective data associated with defects requiring a same type of repair.

10. A device according to claim 9, wherein said data indicator further indicates the type of repair required and tools to be used in the repair.

11. A device according to claim 10 further comprising a video display, wherein said data indicator indicates through the video display.

12. A device according to claim 8 further comprising a video display, wherein said data indicator indicates the defective location on said video display.

13. A device according to claim 8, wherein said data indicator comprises a positioning device arranged to indicate a position of the defective portions by projecting a spotlight.

14. A device according to claim 13, wherein said data indicator indicates a type of repair required and tools to be used in the repair.

15. A device according to claim 13, wherein said data indicator comprises:

an imaging device to image and display the defective portion; and a positioning device to determine a location of the defective portion to be imaged by said imaging device.

16. A device according to claim 8, wherein said data indicator comprises:

an imaging device to image and display the defective portion; and a positioning device to determine a location of the defective portion to be imaged by said imaging device.

17. A device for supporting the repair of defective portions of a substrate on which components are mounted when the defective portions have been discovered during an inspection process, said device comprising:

a recorder configured to record defective data associated with the defective portions discovered in the inspection process;

an evaluation device to calculate a total repair time for the defective portions, and to issue a warning if the total repair time exceeds a predetermined time limit.

18. A device for supporting the repair of defective portions of a substrate on which components are mounted when the defective portions have been discovered during an inspection process, said device comprising:

a recorder configured to record defective data associated with the defective portions in the inspection process; and a data sorter arranged to sort the defective data in an order corresponding to a total repair time of the substrate beginning with a shortest repair time required.

19. A device for supporting the repair of defective portions of a plurality of substrates on which components are mounted when the defective portions have been discovered during an inspection process, said device comprising:

a recorder configured to record defective data associated with the defective portions discovered in the inspection process;

a data sorter arranged to sort the defective data in an order corresponding to a total repair time of the substrate beginning with a shortest repair time required; and an evaluation device to calculate a total repair time for the defective portions, and to issue a warning if the total repair time exceeds a predetermined time limit.

20. A device for supporting the repair of defective portions of a plurality of substrates on which components are mounted when the defective portions have been discovered during an inspection process, said device comprising:

a recorder configured to record defective data associated with the defective portions discovered in the inspection process;

a data sorter arranged to sort the defective data in an order selected from the group consisting of an order corresponding to a total repair time of the substrate beginning with a shortest repair time required and an order grouping together the defective data associated with a same type of defect; and an evaluation device selected from the group consisting of an evaluation device for calculating a total repair time for the defective portions and an evaluation device for indicating a defective location on the substrate where the defective portions were found in the order determined by the defective data associated with the same type of defect in said sorting.

* * * * *